(12) United States Patent
Seo et al.

(10) Patent No.: US 9,356,071 B2
(45) Date of Patent: May 31, 2016

(54) METHODS OF FORMING PATTERNS AND METHODS OF MANUFACTURING SEMICONDUCTOR DEVICES USING THE SAME

(71) Applicants: Bum-Seok Seo, Yongin-si (KR); Ki-Joon Kim, Hwaseong-si (KR); Kil-Ho Lee, Hwaseong-si (KR)

(72) Inventors: Bum-Seok Seo, Yongin-si (KR); Ki-Joon Kim, Hwaseong-si (KR); Kil-Ho Lee, Hwaseong-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/804,310

(22) Filed: Jul. 20, 2015

(65) Prior Publication Data
US 2015/0325625 A1    Nov. 12, 2015

Related U.S. Application Data

(62) Division of application No. 14/210,329, filed on Mar. 13, 2014, now Pat. No. 9,118,002.

(30) Foreign Application Priority Data

Mar. 14, 2013  (KR) .................. 10-2013-0027082

(51) Int. Cl.
| H01L 27/22 | (2006.01) |
|---|---|
| H01L 43/12 | (2006.01) |
| H01L 43/02 | (2006.01) |
| H01L 43/08 | (2006.01) |
| H01L 21/311 | (2006.01) |
| H01L 29/82 | (2006.01) |
| H01L 21/033 | (2006.01) |
| H01L 21/768 | (2006.01) |

(52) U.S. Cl.
CPC .......... *H01L 27/228* (2013.01); *H01L 21/0337* (2013.01); *H01L 21/31144* (2013.01); *H01L 21/76816* (2013.01); *H01L 29/82* (2013.01); *H01L 43/02* (2013.01); *H01L 43/08* (2013.01); *H01L 43/12* (2013.01)

(58) Field of Classification Search
CPC ........................... H01L 27/222; H01L 23/528
See application file for complete search history.

(56) References Cited

U.S. PATENT DOCUMENTS

| 6,567,300 B1 * | 5/2003 | Raberg ................... G11C 11/16 257/E27.005 |
|---|---|---|
| 6,657,270 B2 | 12/2003 | Kim et al. |
| 6,682,943 B2 | 1/2004 | Durcan et al. |

(Continued)

FOREIGN PATENT DOCUMENTS

| KR | 20090014003 A | 2/2009 |
|---|---|---|
| KR | 20090081876 A | 7/2009 |

*Primary Examiner* — Mark Prenty
(74) *Attorney, Agent, or Firm* — Renaissance IP Law Group LLP

(57) ABSTRACT

An insulation layer is formed on a substrate. A first mask is formed on the insulation layer. The first mask includes a plurality of line patterns arranged in a second direction. The plurality of line patterns extend in a first direction substantially perpendicular to the second direction. A second mask is formed on the insulation layer and the first mask. The second mask includes an opening partially exposing the plurality of line patterns. The opening has an uneven boundary at one of a first end portion in the first direction and a second end portion in a third direction substantially opposite to the first direction. The insulation layer is partially removed using the first mask and the second mask as an etching mask, thereby forming a plurality of first trenches and second trenches. The plurality of first trenches and the second trenches are arranged in a staggered pattern.

2 Claims, 26 Drawing Sheets

(56) References Cited

U.S. PATENT DOCUMENTS

| | | | |
|---|---|---|---|
| 7,071,009 B2 | 7/2006 | Wang et al. | |
| 7,349,234 B2 * | 3/2008 | Peng | G11C 11/15 365/158 |
| 7,876,591 B2 | 1/2011 | Kwak | |
| 8,674,522 B1 | 3/2014 | Pratt et al. | |
| 9,118,002 B2 * | 8/2015 | Seo | H01L 43/12 |
| 2009/0263749 A1 | 10/2009 | Sim et al. | |
| 2009/0298276 A1 | 12/2009 | Lee et al. | |
| 2010/0155906 A1 | 6/2010 | Lee et al. | |
| 2011/0089507 A1 | 4/2011 | Mao | |

* cited by examiner

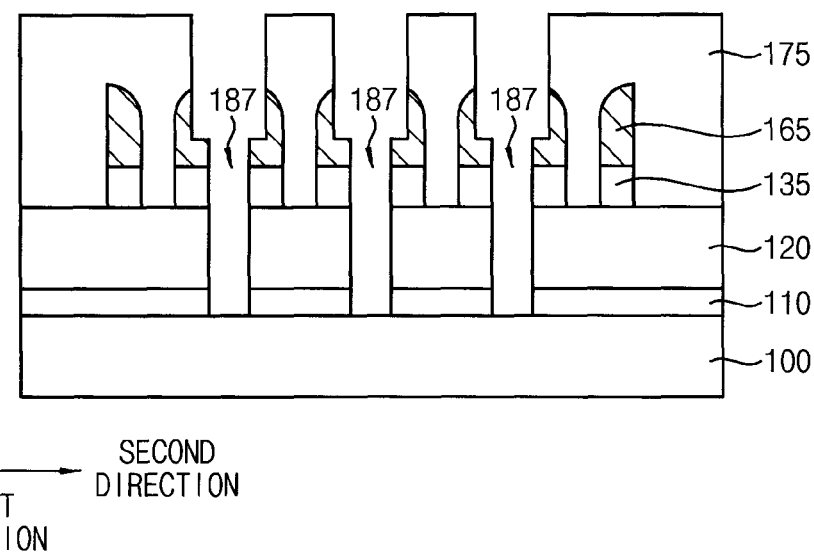

METHODS OF FORMING PATTERNS AND METHODS OF MANUFACTURING SEMICONDUCTOR DEVICES USING THE SAME

CROSS-REFERENCE TO RELATED APPLICATIONS

This U.S. non-provisional patent application is a divisional of U.S. patent application Ser. No. 14/210,329, filed Mar. 13, 2014 which application claims priority under 35 USC §119 to Korean Patent Application No. 10-2013-0027082, filed on Mar. 14, 2013 in the Korean Intellectual Property Office (KIPO), the contents of which are herein incorporated by reference in their entirety.

BACKGROUND

1. Field

Example embodiments relate to methods of forming conductive patterns such as bit lines and methods of manufacturing semiconductor devices using the same.

2. Description of the Related Art

Recently, as semiconductor devices have become more highly integrated, a width of a line pattern such as a wiring structure space has decreased. When metal is used to form the line pattern, it is hard to pattern the metal layer. Therefore, a damascene process may be used to form the line pattern. However, a trim process to separate each line pattern may be required.

SUMMARY

Example embodiments provide a method of forming conductive patterns having an improved productivity.

Example embodiments provide a method of manufacturing a semiconductor device having an improved productivity.

According to example embodiments, there is provided a method of forming a conductive pattern. In the method, an insulation layer is formed on a substrate. A first mask is formed on the insulation layer. The first mask includes a plurality of line patterns arranged in a second direction. The plurality of line patterns extend in a first direction substantially perpendicular to the second direction. A second mask is formed on the insulation layer and the first mask. The second mask includes an opening partially exposing the line patterns. The opening has an uneven boundary at one of a first end portion thereof in the first direction and a second end portion thereof in a third direction substantially opposite to the first direction. The insulation layer is partially removed using the first mask and the second mask as an etching mask, thereby forming a plurality of first trenches and second trenches. The plurality of first and second trenches are arranged in a staggered (or offset) pattern. The plurality of first and second trenches are filled with a conductive material.

In example embodiments, the first end portion may include a plurality of first protrusion portions arranged in the second direction, and the second end portion may include a plurality of second protrusion portions arranged in the second direction. The first protrusion portions may project in the first direction, and the second protrusion portions may project in the third direction.

In example embodiments, the first protrusion portions and the second protrusion portions may not be overlapped with each other.

In example embodiments, the first protrusion portions and the second protrusion portions may have a rectangular shape, a triangle shape, a semicircular shape, a semi-elliptical shape or a polygonal shape, when viewed in plan view.

In example embodiments, the first end portion may include a plurality of first protrusion portions arranged in the second direction, and each of the first protrusion portions may project in the first direction.

In example embodiments, forming the first mask may include forming a first mask layer on the insulation layer, forming a plurality of sacrificial layer patterns arranged in the second direction, forming a spacer layer on a top surface of the first mask layer and top surfaces and sidewalls of the sacrificial layer patterns, removing portions of the spacer layer on the top surfaces of the first mask layer and the sacrificial layer patterns to form a spacer on the sidewalls of the sacrificial layer patterns, removing the sacrificial layer patterns and etching the first mask layer using the spacer as an etching mask. The sacrificial layer patterns may extend in the first direction. The spacer layer may have a uniform thickness.

In example embodiments, forming the first mask layer may include depositing titanium nitride at a temperature below about 270° C.

In example embodiments, forming the spacer layer may include performing an atomic layer deposition process.

In example embodiments, forming the first mask may include forming a first mask layer on the insulation layer, forming a plurality of dummy patterns arranged in the second direction, forming a spacer layer on a top surface of the first mask layer and top surfaces and sidewalls of the dummy patterns, forming a preliminary mask layer on the spacer layer, removing the upper portions of the preliminary mask layer and the spacer layer to form the preliminary mask exposing top surfaces of the dummy patterns, partially removing the spacer layer to expose the first mask layer and etching the first mask layer using the dummy patterns and the preliminary mask. Each of the plurality of dummy patterns may extend in the first direction. The spacer layer may have a substantially uniform thickness.

In example embodiments, filling the plurality of first trenches and second trenches may include forming a conductive layer using copper on the insulation layer to fill the first and second trenches and planarizing an upper portion of the conductive layer until a top surface of the insulation layer is exposed.

According to example embodiments, there is provided a method of manufacturing a semiconductor device. In the method, a digit line is formed on a substrate. The digit line extends in a second direction. A magnetic tunnel junction pattern may include a pinning layer pattern, a pinned layer pattern, a tunneling layer pattern and a free magnetic layer pattern. Depending on the applications, the pinning layer may be omitted. The magnetic tunnel junction pattern overlaps at least a portion of the digit line. An insulating interlayer is formed to cover the magnetic tunnel junction pattern. A plurality of bit lines extending in a first direction substantially perpendicular to the second direction is formed on the insulating interlayer. The bit lines are electrically connected to the magnetic tunnel junction pattern. In the method of forming the bit lines, an insulation layer is formed on the insulating interlayer. A first mask is formed on the insulation layer. The first mask includes a plurality of line patterns arranged in the second direction. The line patterns extend in the first direction substantially perpendicular to the second direction. A second mask is formed on the insulation layer and the first mask. The second mask includes an opening partially exposing the line patterns. The opening has an uneven boundary at one of a first end portion in the first direction and a second end portion in a third direction substantially opposed to the first direction. The insulation layer is partially removed using the first mask and the second mask as an etching mask, thereby forming a plurality of first trenches and second trenches. The plurality of first trenches and the second trenches are arranged in a zig-zagged pattern. The plurality of first trenches and second trenches are filled with a conductive material.

In example embodiments, the first end portion may include a plurality of first protrusion portions arranged in the second direction, and the second end portion may include a plurality of second protrusion portions arranged in the second direction. The first protrusion portions may project in the first direction, and the second protrusion portions may project in the third direction.

In example embodiments, the first protrusion portions and the second protrusion portions may not overlap with each other.

In example embodiments, the first protrusion portions and the second protrusion portions may have a rectangular shape, a triangle shape, a semicircular shape, a semi-elliptical shape or a polygonal shape.

In example embodiments, the first end portion may include a plurality of first protrusion portions arranged in the second direction, and the first protrusion portions may project in the first direction.

According to example embodiments, a plurality of first trenches and a plurality of second trenches may be arranged alternately and repeatedly. Each of the first trenches may have an end portion projecting in the first direction, and each of the second trenches may have an end portion projecting in the third direction. Therefore, when a plurality of first and second bit line patterns are respectively formed in the plurality of first trenches and second trenches, a trimming process for separating the first and second bit line patterns may be omitted.

BRIEF DESCRIPTION OF THE DRAWINGS

Example embodiments will be more clearly understood from the following detailed description taken in conjunction with the accompanying drawings. FIGS. 1 to 33 represent non-limiting, example embodiments as described herein.

FIGS. 1A-1B, 2A-2B, 3A-3B, 4A-4B, 5A-5C, 6A-6C, 7A-7C and 8A-8C are plan views and cross-sectional views illustrating a method of forming a pattern in accordance with example embodiments;

FIGS. 9A-9B, 10 and 11 are plan views illustrating a method of forming a pattern in accordance with other example embodiments;

FIGS. 12 to 14 are plan views illustrating a method of forming a pattern in accordance with other example embodiments;

FIGS. 15 to 24 are plan views and cross-sectional views illustrating a method of forming a pattern in accordance with other example embodiments; and FIGS. 25 to 32 are plan views and cross-sectional views illustrating a method of manufacturing a semiconductor device in accordance with example embodiments.

FIG. 33 is a schematic block diagram illustrating an example of information processing systems including a semiconductor device according to example embodiments.

DETAILED DESCRIPTION OF THE EMBODIMENTS

Figure 1A:
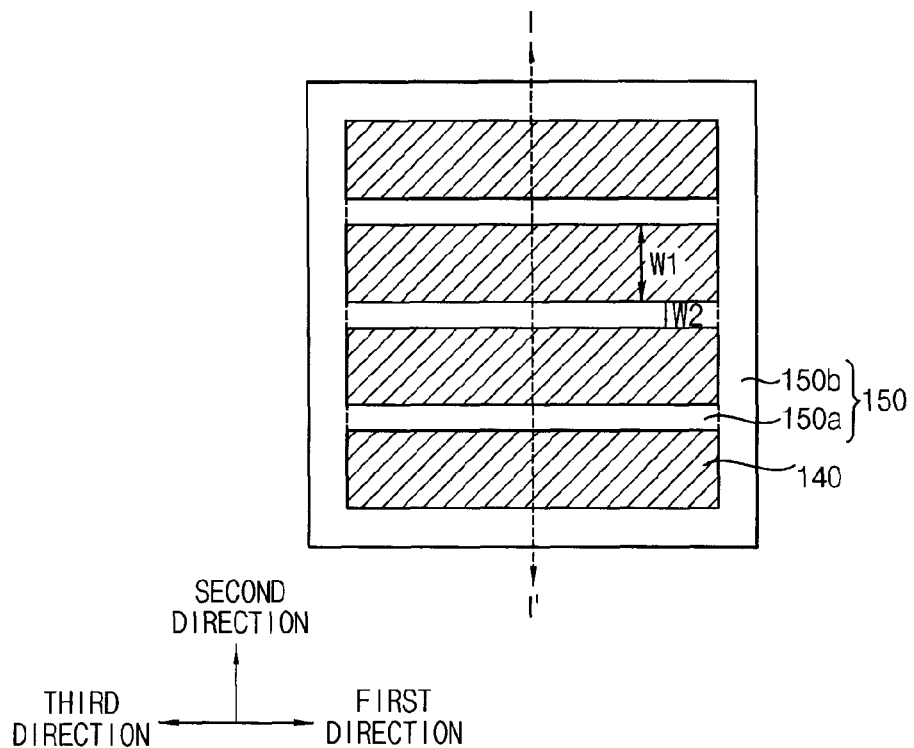

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 8 are plan views and cross-sectional views illustrating a method of forming a pattern in accordance with example embodiments.

Particularly, FIGS. 1A, 2A, 3A, 4A, 5A, 6A, 7A and 8A are plan views illustrating a method of forming the pattern in accordance with example embodiments. FIGS. 1B, 2B, 3B, 4B, 5B, 6B, 7B and 8B are cross-sectional views cut along line I-I' in FIGS. 1A, 2A, 3A, 4A, 5A, 6A, 7A and 8A, and FIGS. 5C, 6C, 7C and 8C are cross-sectional views cut along line II-II' in FIGS. 5A, 6A, 7A and 8A.

Figure 1B:
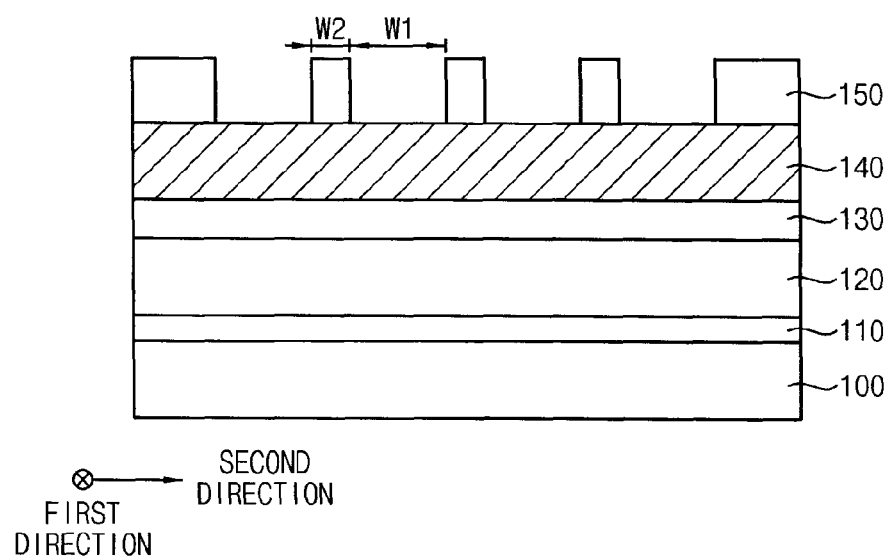

Referring to FIGS. 1A and 1B, an etch stop layer 110, an insulation layer 120, a first mask layer 130, a sacrificial layer 140 and a first photoresist layer 150 may be sequentially formed on a substrate 100.

The substrate 100 may include a semiconductor substrate. For example, the substrate 100 may include as a silicon substrate, a germanium substrate or a silicon-germanium substrate, a silicon-on-insulator (SOI) substrate or a germanium-on-insulator (GOI) substrate.

The etch stop layer 110 may be formed using a material having an etch selectivity with respect to the insulation layer 120. In example embodiments, the etch stop layer 110 may be formed using silicon nitride, when the insulation layer 120 includes silicon oxide.

In example embodiment, the insulation layer 120 may be formed using silicon oxide such as boro-phospho-silicate glass (BPSG), tonen silazene (TOSZ), undoped silicate glass (USG), spin on glass (SOG), flowable oxide (FOX), tetra-ethyl-ortho-silicate (TEOS) or high density plasma chemical vapor deposition (HDP-CVD).

Further, the first mask layer 130 may be formed using a material having an etch selectivity with respect to the insulation layer 120. Additionally, the material of the first mask layer 130 may be selected considering the process temperature at which the first mask layer 130 is formed. In example embodiments, the first mask layer 130 may be formed using titanium nitride (TiN) by a sputtering process or a chemical vapor deposition process at a temperature below about 270° C. When the first mask layer 130 is formed using titanium nitride, the process for forming the first mask layer 130 may be performed at a relatively low temperature, so that a semiconductor device (for example, a magnetic random access memory cell) disposed under the first mask layer 130 may not be thermally damaged.

In example embodiments, the sacrificial layer 140 may be formed using a nitride such as silicon nitride, titanium nitride, silicon based spin-on hard mask (Si—SOH), carbon based spin-on hardmask (C—SOH) or amorphous carbon layer (ACL).

The first photoresist layer pattern 150 may be formed by forming a first photoresist layer on the sacrificial layer 140, and by patterning the first photoresist layer through an exposure process and a develop process. The first photoresist layer pattern 150 may include a first line pattern 150a and a first connection pattern 150b. In example embodiments, a plurality of first line patterns 150a may be arranged along a second direction. Each of the first line patterns 150a may extend in a first direction substantially perpendicular to the second direction. Further, the first connection pattern 150b connecting the first line patterns 150a may be disposed in an edge portion of the substrate 100. Therefore, the first photoresist layer pattern 150 may expose portions of a top surface of the sacrificial layer 140. The exposed portions of the sacrificial layer 140 may be arranged in the second direction, and each of the exposed portions of the sacrificial layer 140 may extend in the first direction. In this case, the exposed portion of the sacrificial layer 140 may have a first width W1 in the second direction, and the first line pattern 150a may have a second width W2 in the second direction. For example, the first width W1 may be three times larger than the second width W2.

Figure 2A:
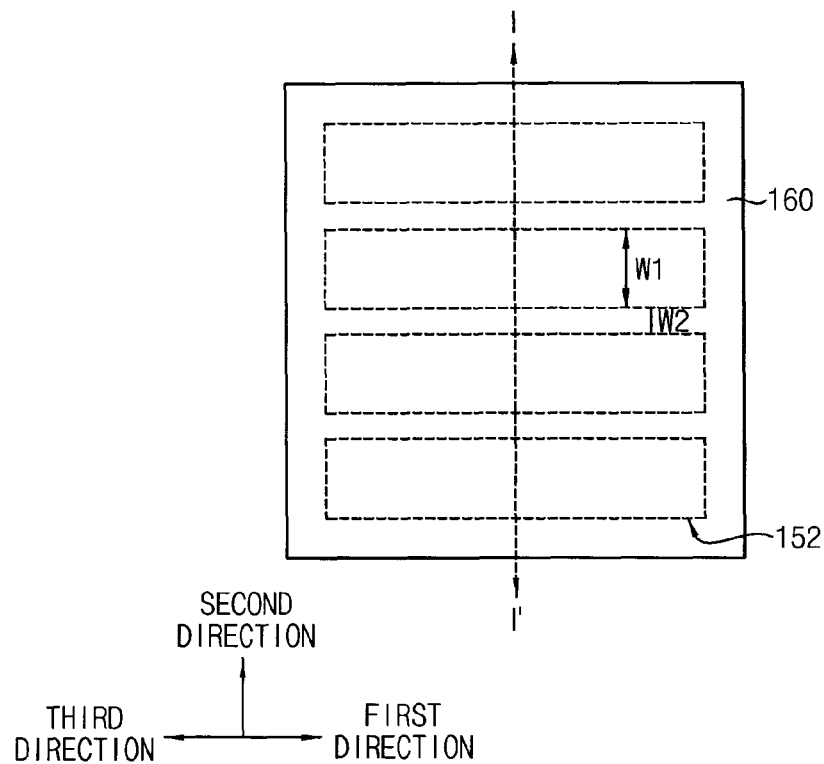
Figure 2B:
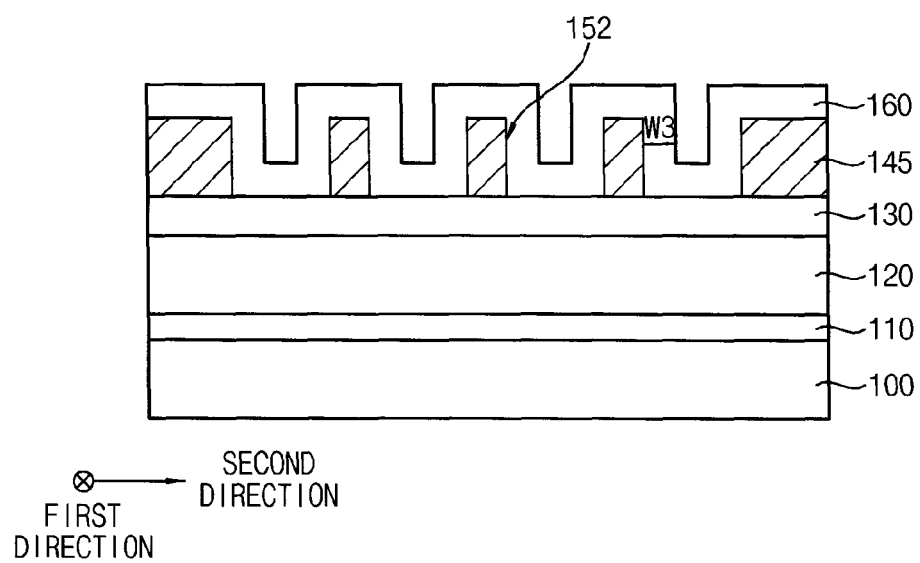

Referring to FIGS. 2A and 2B, the sacrificial layer 140 may be partially removed by an etching process using the first photoresist layer pattern 150 as an etch mask, thereby forming first openings 152 and converting the sacrificial layer 140 into the sacrificial layer pattern 145. Then, a spacer layer 160 may be formed on the first mask layer 130 to cover the sacrificial layer pattern 145.

Each of the first openings 152 may have the first width W1 in the second direction, and may extend in the first direction. The sacrificial layer pattern 145 may have a shape corresponding to the first photoresist layer pattern 150.

Further, the spacer layer 160 having a uniform thickness may be formed on a top surface of the first mask layer 130 exposed by the first openings 152 and a top surface and a sidewall of the first sacrificial layer pattern 145. In example embodiments, the spacer layer 160 may be formed using a material having an etch selectivity with respect to the sacrificial layer pattern 145 (e.g. silicon oxide), for example, by an atomic layer deposition (ADL) process. When the spacer layer 160 is formed by the ALD process, the spacer layer 160 may be conformally formed on the sidewall of the sacrificial layer pattern 145 having a relatively large aspect ratio. In example embodiments, the spacer layer 160 may have a thickness W3 in the second direction.

Figure 3A:
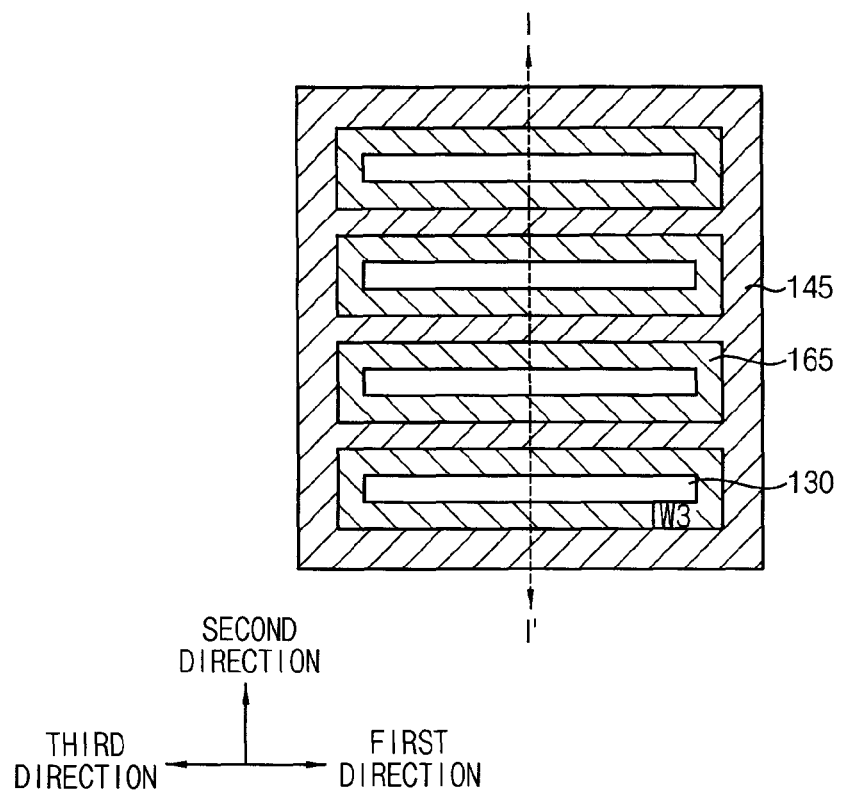
Figure 3B:
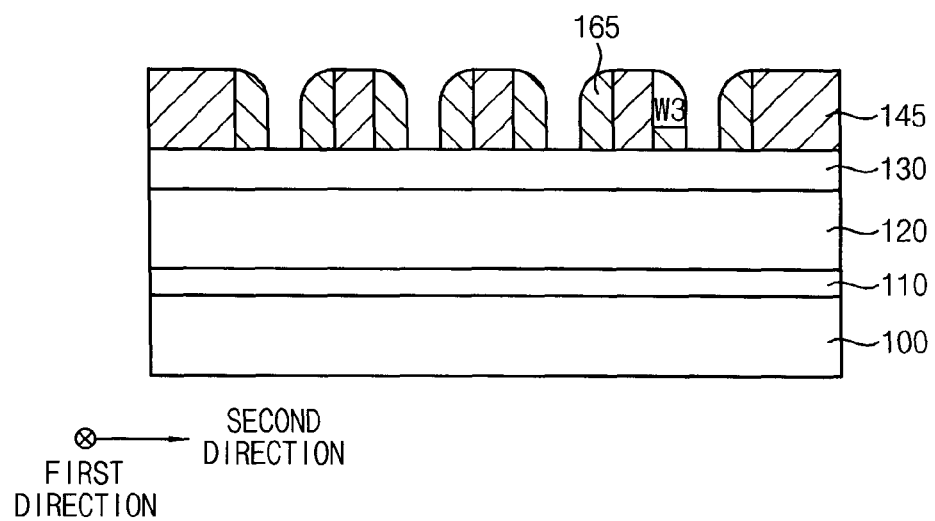

Referring to FIGS. 3A and 3B, the spacer layer 160 may be partially removed to form a spacer 165.

In example embodiment, portions of the spacer layer 160 disposed on top surfaces of the sacrificial layer pattern 145 and the first mask layer 130 may be removed by an anisotropic etching process. Therefore, the spacer 165 may be formed to surround the sidewall of the sacrificial layer pattern 145. The spacer 165 may have the third thickness W3. In this case, the spacer 165 may form a closed loop, when viewed in plan view. The spacer layer 160 formed by the ALD process may have a uniform thickness, so that the spacer 165 may have a uniform width (that is, W3).

Figure 4A:
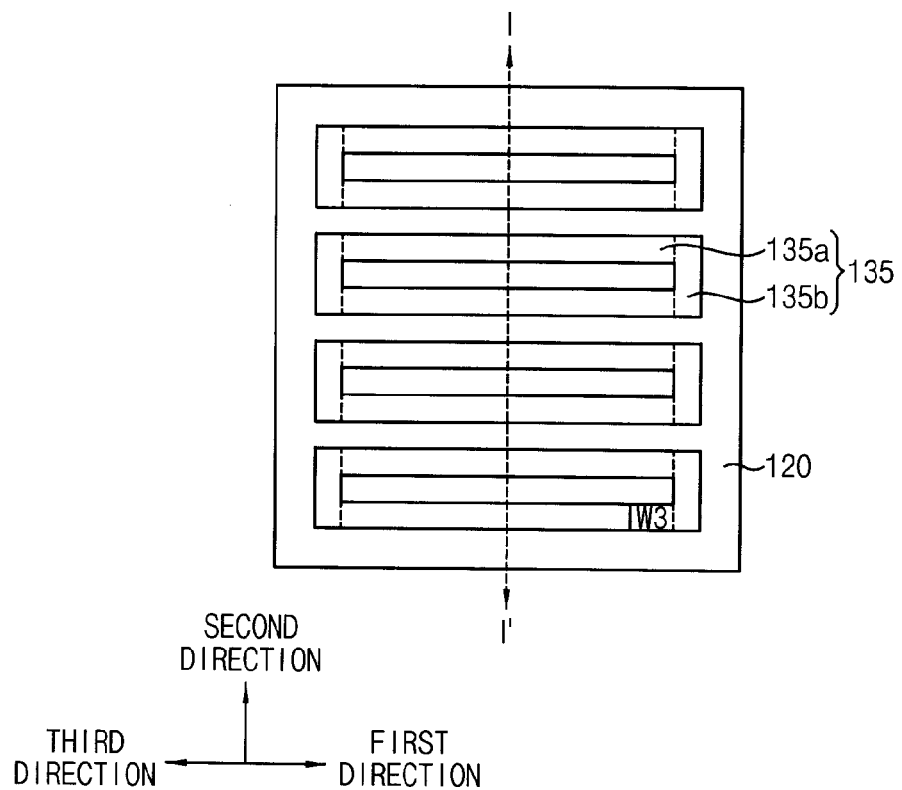
Figure 4B:
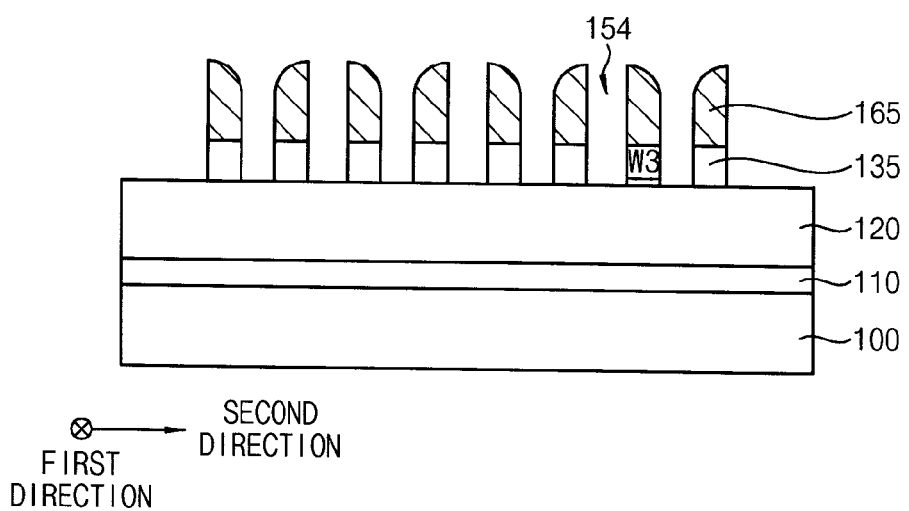

Referring to FIGS. 4A and 4B, after removing the sacrificial layer pattern 145, the first mask layer 130 may be partially removed to form the first mask 135. For the sake of convenience, FIG. 4A does not show the spacer 165, and does show the substrate 100 having the first mask 135 and the insulation layer 120.

Firstly, the sacrificial layer pattern 145 may be removed by an ashing process or an etching process. The etching process may use an etching gas having a relatively high etch rate about the sacrificial layer pattern 145.

Then, the first mask layer 130 may be etched using the spacer 165 as an etch mask. Therefore, the first mask 135 may be formed to have a shape corresponding to the spacer 165. That is, the first mask 135 may have a closed loop shape, when viewed in plan view. In example embodiments, the first mask 135 may include a plurality of second line patterns 135a and a plurality of second connection patterns 135b. The plurality of second line patterns 135a may be arranged in the second direction, each of the second line patterns 135a may extend in the first direction. The second connection patterns 135b may connect the second line patterns 135a, and may be disposed in the edge portion of the substrate 100. In this case, the second line pattern 135a may have the third width W3 in the second direction.

Further, a second opening 154 may be defined by the spacer 165 and the first mask 135. The second opening 154 may partially expose the insulation layer 120. In example embodiments, a plurality of second openings 154 may be arranged in the second direction. Each of the second openings 154 may extend in the first direction.

Figure 5A:
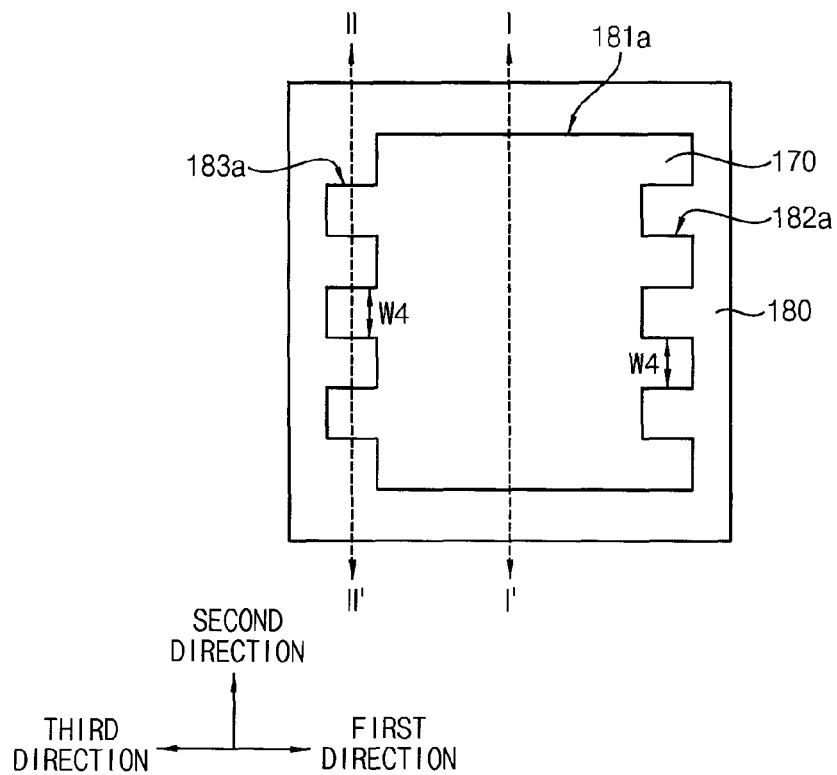
Figure 5B:
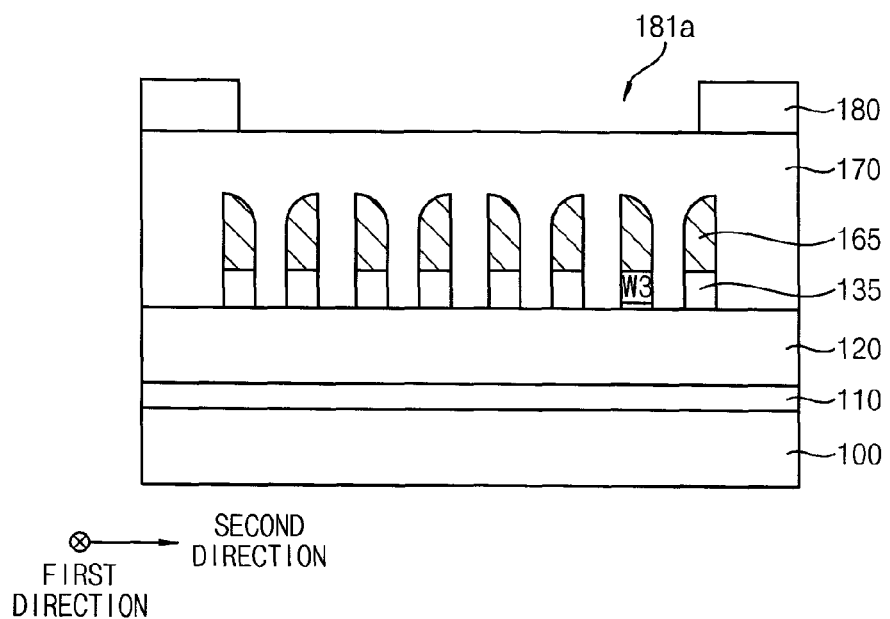
Figure 5C:
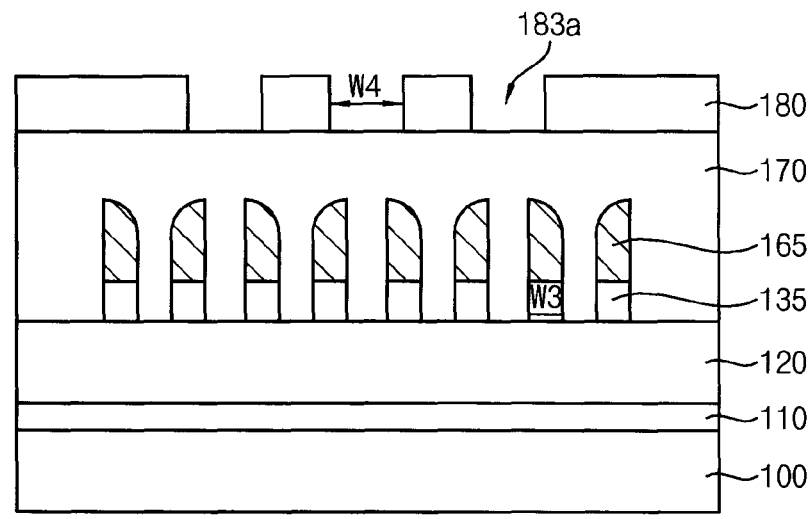

Referring to FIGS. 5A, 5B and 5C, after forming a second mask layer 170 on the insulation layer 120 to cover the first mask 135 and the spacer 165, a second photoresist layer pattern 180 may be formed on the second mask layer 170.

The second mask layer 170 may be formed using a material having an etch selectivity with respect to the insulation layer 120, the first mask 135 and the spacer 165. For example, the second mask layer 170 may be formed using a material substantially the same as that of the sacrificial layer 140.

Then, a second photoresist layer may be formed on the second mask layer 170, and then the second photoresist layer may be patterned to form the second photoresist layer pattern 180.

In plan view, the second photoresist layer pattern 180 may have a third opening 181a exposing a top surface of the second mask layer 170. That is, the third opening 181a may be defined by a sidewall of the second photoresist layer pattern 180 and the top surface of the second mask layer 170. In this case, the third opening 181a may have an uneven boundary extending along the second direction at both end portions in the first direction and a third direction opposite to the first direction. That is, a first end portion of the third opening 181a may include a first protrusion portion 182a extending in the first direction, and a second end portion opposite to the first end portion may include a second protrusion portion 183a extending in the third direction. In example embodiments, a plurality of first protrusion portions 182a and a plurality of second protrusion portions 183a may be arranged in the second direction.

In an example embodiment, the first protrusion portion 182a and the second protrusion portion 183a may not overlap with each other in the first direction. Therefore, the plurality of first protrusion portions 182a and second protrusion portions 183a may be arranged alternately and repeatedly. That is, the plurality of first protrusion portions 182a and second protrusion portions 183a may be arranged in a staggered pattern, and the third opening 181a may have a uniform width in the first direction.

As illustrated in FIG. 5A, each of the first protrusion portions 182a and the second protrusion portions 183a may have a rectangular shape in plan view. However, the present invention may not be limited thereto. For example, the first protrusion portion 182a and the second protrusion portion 183a may have various shapes such as a triangle shape, a semicircular shape, a semi-elliptical shape, a polygonal shape, etc. Further, each of the first protrusion portions 182a and the second protrusion portions 183a may have a fourth width W4 in the second direction.

In an example embodiment, each of the first protrusion portions 182a and the second protrusion portions 183a may partially overlap two of the second line patterns 135a.

Figure 6A:
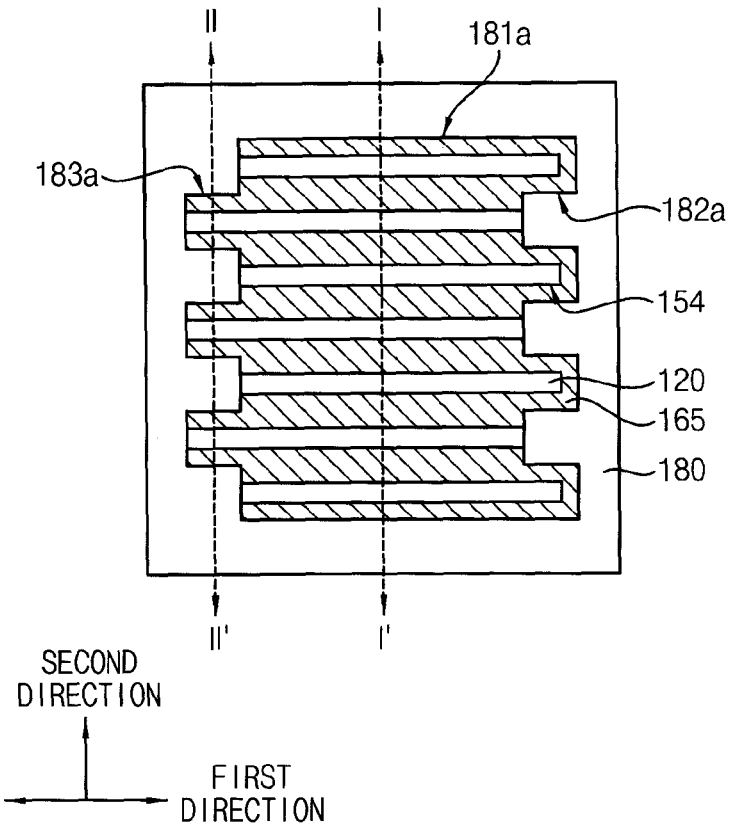
Figure 6B:
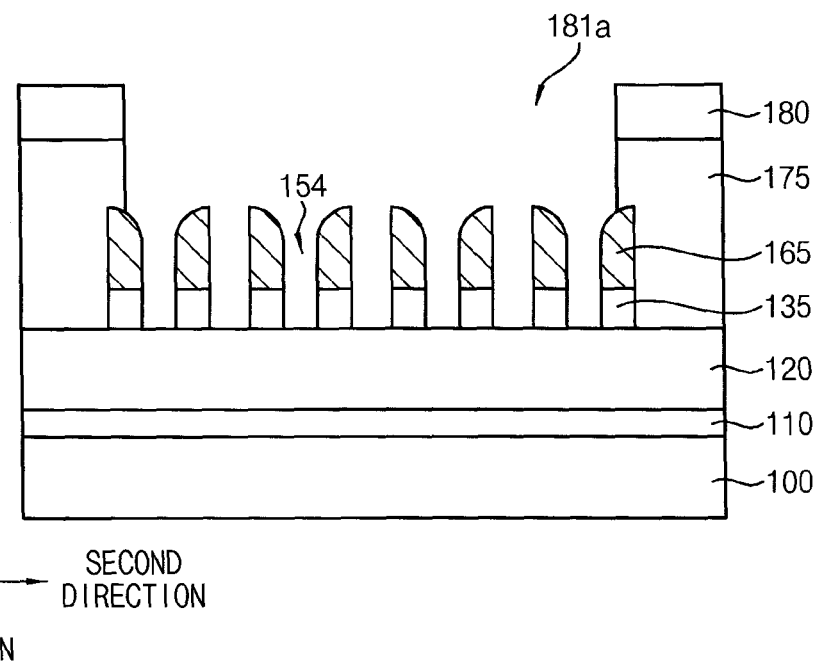
Figure 6C:
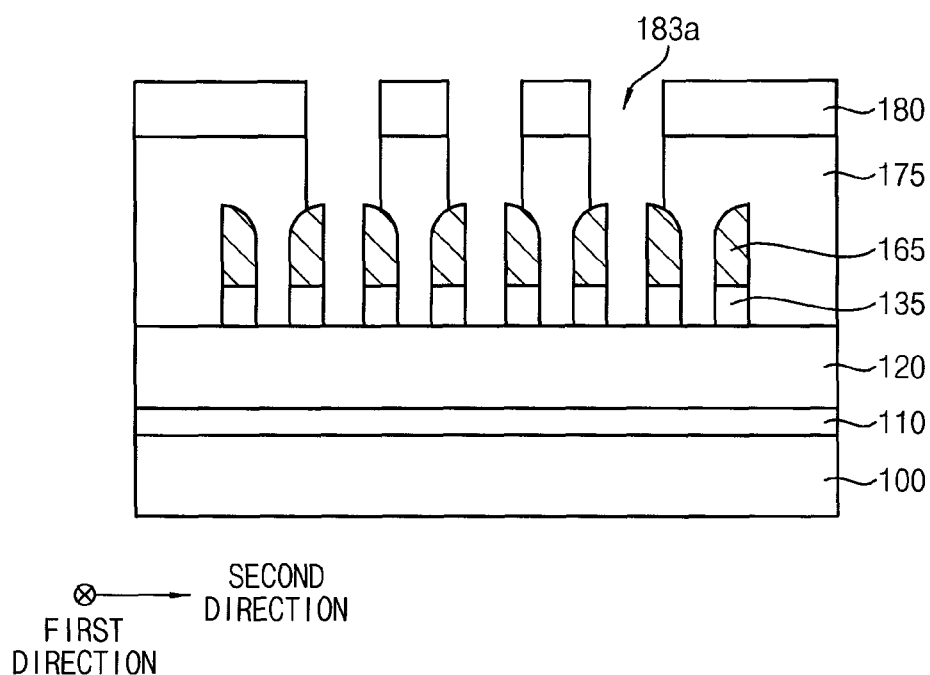

Referring to FIGS. 6A, 6B and 6C, the second mask layer 170 may be partially removed using the second photoresist layer pattern 180, thereby forming the second mask 175.

That is, portions of the second mask layer 170 exposed by the third opening 181a may be removed, such that portions of the insulation layer 120 may be exposed by the third opening 181a. In this case, the portions of the insulation layer 120 exposed by the third opening 181a may be arranged in a staggered pattern.

Further, a plurality of second openings 154 defined by the spacer 165 and the first mask 135 may be formed again to expose the insulation layer 120. In example embodiments, each of the first protrusion portions 182a and the second protrusion portions 183a may correspond to each of the second openings 154. The first protrusion portions 182a and the second protrusion portions 183a may have a fourth width W4 in the second direction.

Then, the remaining portion of the second photoresist layer pattern 180 may be removed by an ashing process.

Figure 7A:
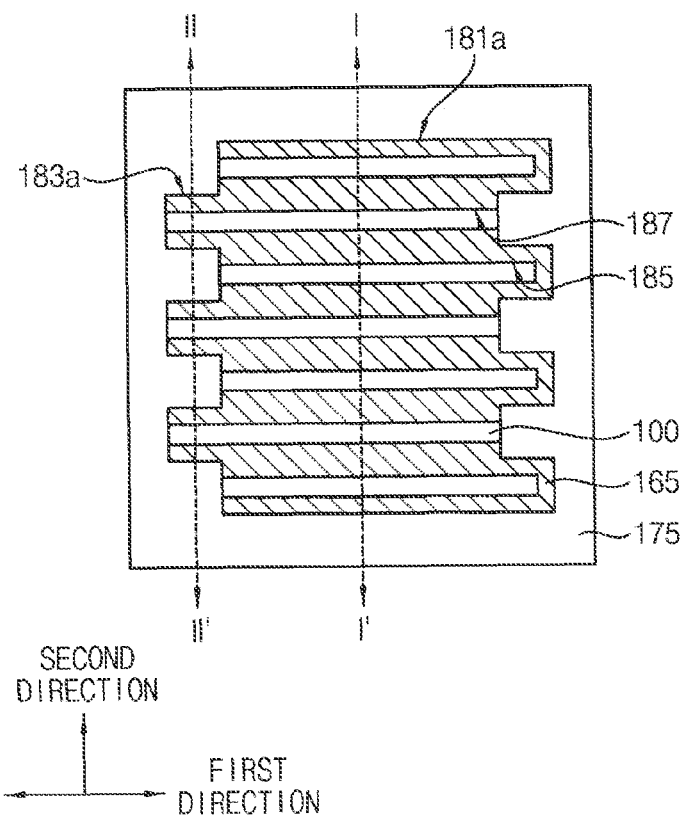
Figure 7B:
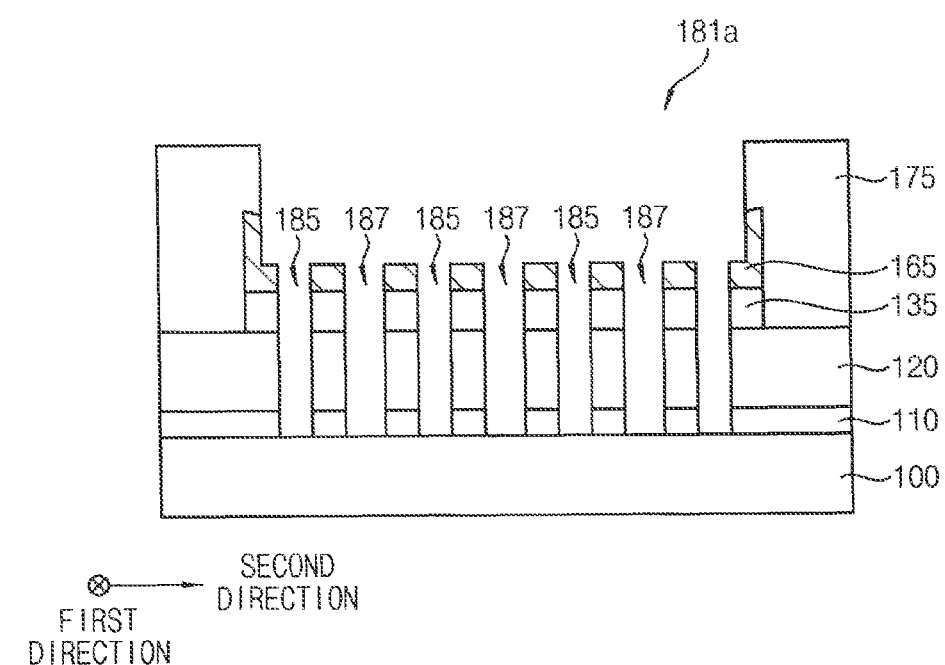

Referring to FIGS. 7A, 7B and 7C, the insulation layer 120 and the etch stop layer 110 may be partially removed by an etching process, using the first mask 135, the spacer 165 and the second mask 175 as an etch mask, thereby forming a plurality of first trenches 185 and a plurality of second trenches 187.

The etching process may be performed using an etching gas having a relatively high etch rate with respect to the insulation layer 120. Therefore, portions of the insulation layer 120, which may not be covered with the first and second masks 135 and 175 and the spacer 165, may be removed, and portions of the spacer 165, that may not be covered with the second mask 175 may also be partially removed. In the etching process, the etch stop layer 110 may serve as an etch end point.

Then, the etch stop layer 110 may be partially removed by an etching process using the first and second masks 135 and 175, the spacer 165 and the insulation layer 120 as an etch mask. Therefore, the first trenches 185 and the second trenches 187 may be formed through the etch stop layer 110 and the insulation layer 120.

In example embodiment, the plurality of first trenches 185 and the plurality of second trenches 187 may be arranged alternately and repeatedly in the second direction. Each of the first trenches 185 and the second trenches 187 may extend in the first direction. In this case, the first trenches 185 and the second trenches 187 may be arranged in the staggered pattern according to the first and second protrusion portions 182a and 183a of the third opening 181a. That is, the first trenches 185 may be shifted along the first direction with respect to the second trenches 187.

Figure 8A:
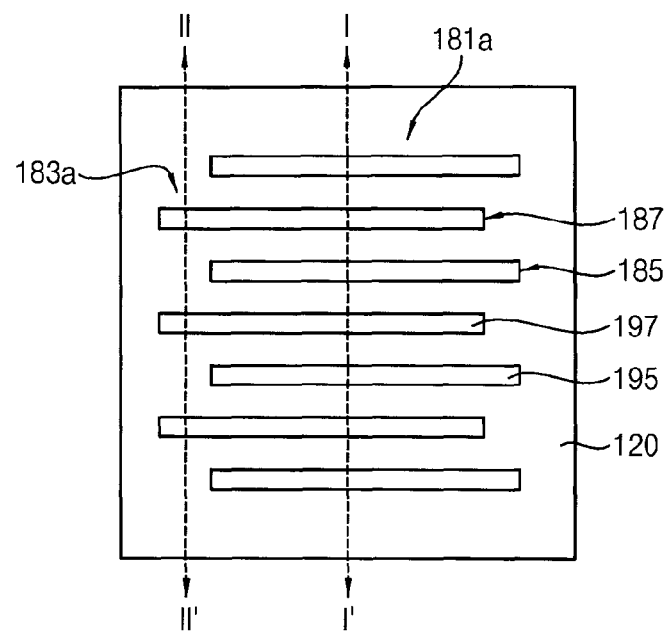
Figure 8A:
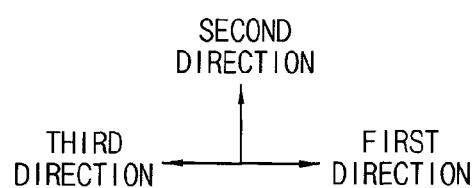
Figure 8B:
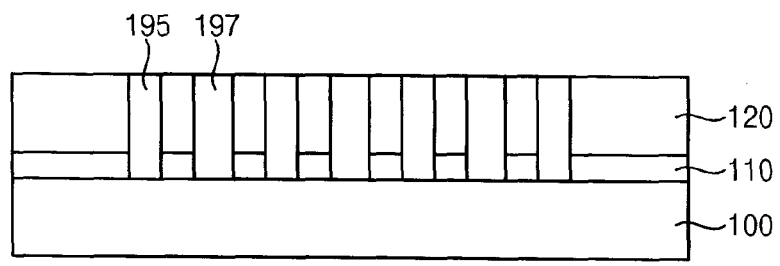
Figure 8B:
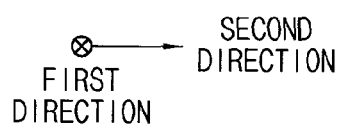
Figure 8C:
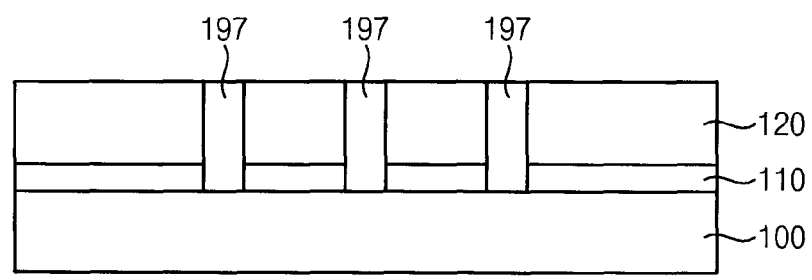
Figure 8C:
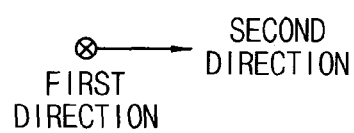

Referring to FIGS. 8A, 8B and 8C, the first and second masks 135 and 175 and the spacer 165 may be removed, and then first patterns 195 and the second patterns 197 may be formed in the first trenches 185 and the second trenches 187, respectively.

Particularly, the first and second masks 135 and 175 and the spacer 165 may be removed by an ashing process and/or a dry etching process. A conductive layer may be formed on the insulation layer 120 and the substrate 100 to fill the first and second trenches 185 and 187, and then upper portion of the conductive layer may be planarized to form the first patterns 195 and the second patterns 197. In example embodiments, the planarization process may be performed by an etch back process and/or a CMP process, until a top surface of the insulation layer 120 is exposed.

For example, the conductive layer may be formed using a metal such as copper (Cu), aluminum (Al), tungsten (W), ruthenium (Ru), etc. or a conductive metal nitride such as titanium nitride (TiNx), tantalium nitride (TaNx), etc. For example, the first patterns 195 and the second patterns 197 include copper (Cu) to have a relatively small resistance. In an example embodiment, a copper (Cu) seed layer may be formed on the substrate 100, the etch stop layer 110 and the insulation layer 120, and then the conductive layer may be formed by an electro-plating process or a CVD process.

In example embodiment, the plurality of first patterns 195 and the plurality of second patterns 197 may be arranged alternately and repeatedly in the second direction. Each of the first patterns 195 and the second patterns 197 may extend in the first direction. In this case, the first patterns 195 and the second patterns 197 may be arranged in a staggered pattern with respect to the first and second trenches 185 and 187. The first patterns 195 may be shifted in the first direction with respect to the second patterns 197. That is, end portions of the first patterns 195 may protrude from end portions of the second patterns 197 in the first direction, and opposite end portions of the second patterns 197 may protrude from opposite end portions of the first patterns 195 in the third direction. Therefore, end portions of the first patterns 195 may be separated from end portions of the second patterns 197.

A diffusion stop layer may be further formed between the first and second patterns 195 and 197 and the substrate 100. The diffusion stop layer may include a nitride such as titanium nitride. The diffusion stop layer may surround sidewalls and bottom surface of the first and second patterns 195 and 197.

According to some embodiments, the first patterns 195 and the second patterns 197 may be arranged alternately and repeatedly. Each of the first patterns 195 may have an end portion projecting in the first direction, and each of the second patterns 197 may have an end portion projecting in the third direction. Therefore, when the first and second patterns 195 and 197 are used as bit lines of a semiconductor device, a trim process for separating the bit lines may be omitted.

Figure 9A:
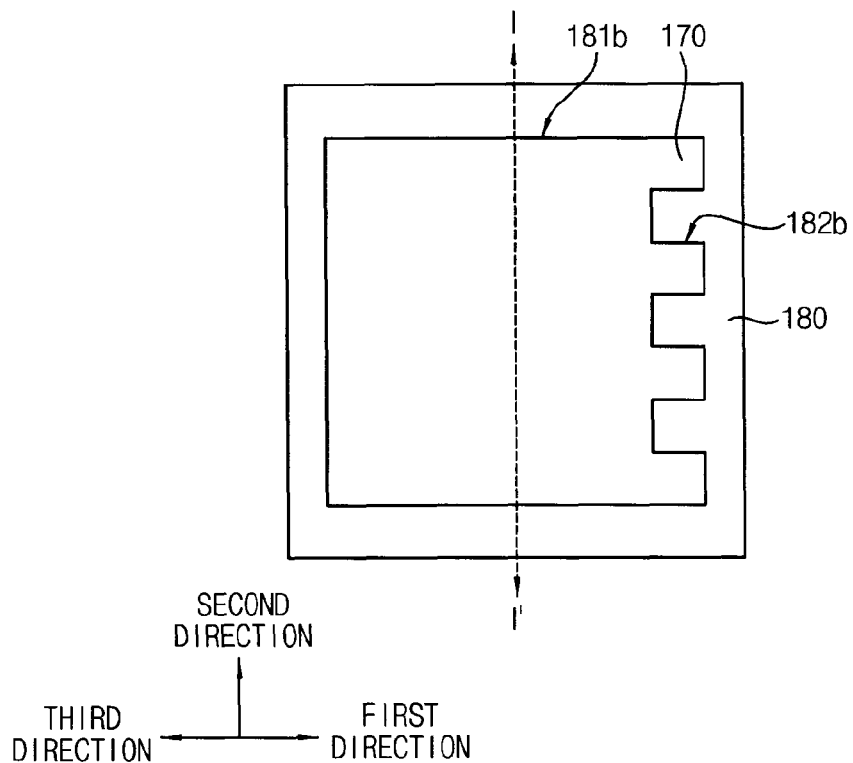
Figure 9B:
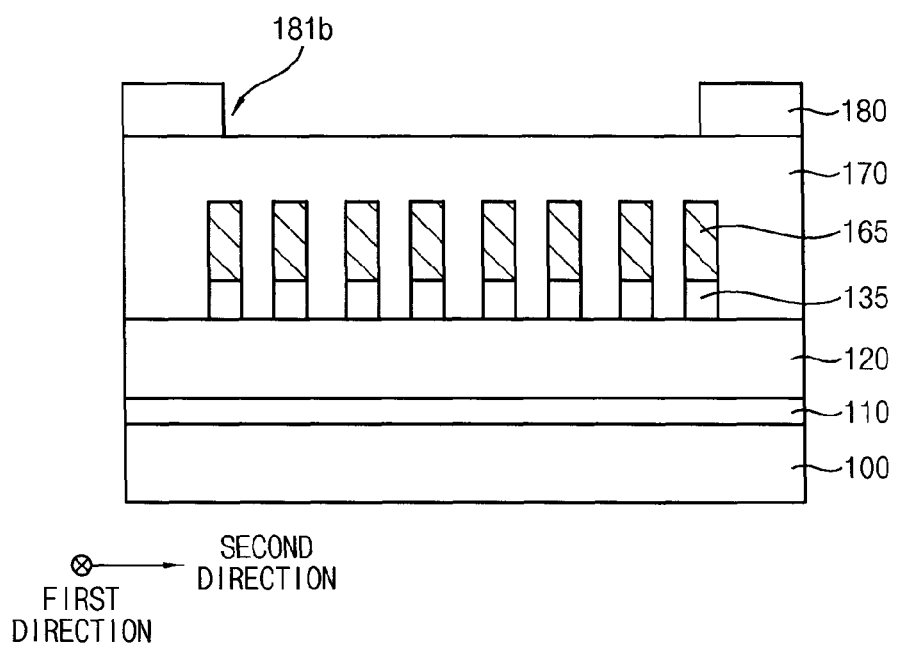
Figure 10:
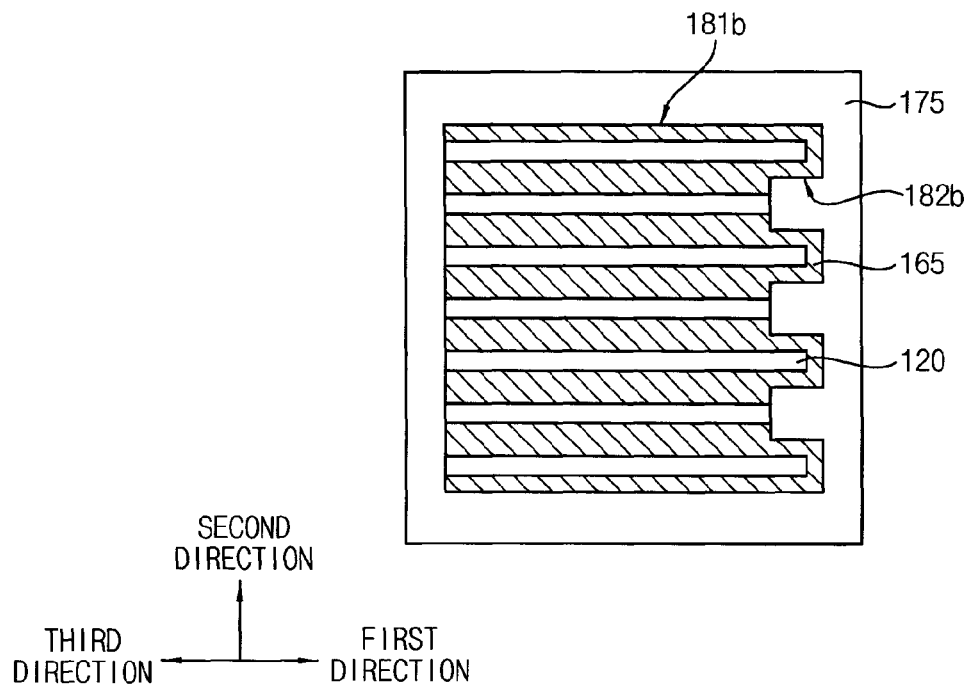
Figure 11:
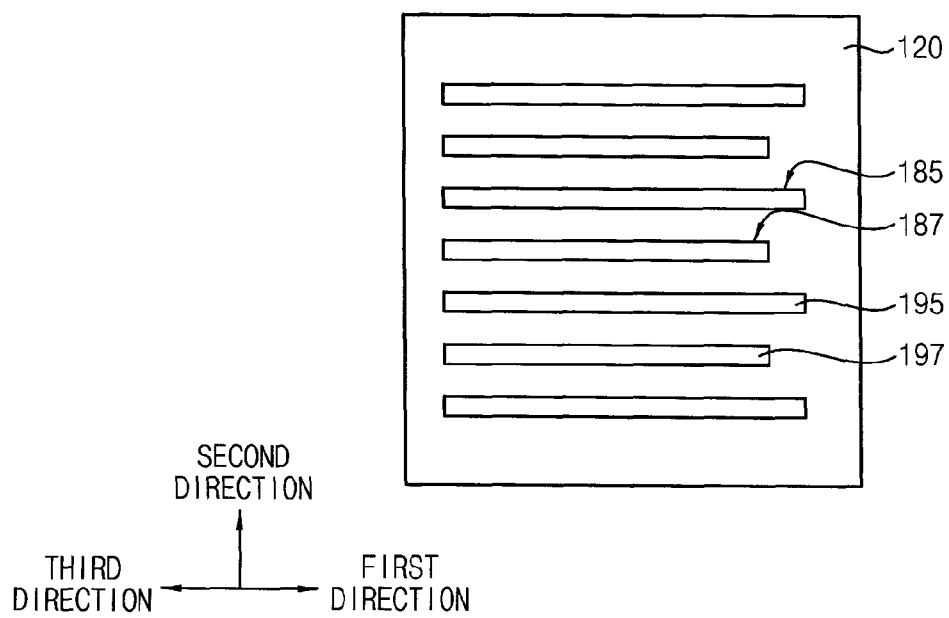

FIGS. 9 to 11 are plan views illustrating a method of forming a pattern in accordance with other example embodiments. The method of forming the pattern may be substantially the same as or similar to those illustrated with reference to FIGS. 1 to 8. Thus, like reference numerals refer to like elements, and repetitive explanations thereon may be omitted herein.

Firstly, processes substantially the same as or similar to those illustrated with reference to FIGS. 1 to 4 may be performed. That is, an etch stop layer 110 and an insulation layer 120 may be formed on a substrate 100, a first mask 135 and a spacer 165 may be formed on the insulation layer 120. In this case, the first mask 135 may include a plurality of second line patterns and a second connection pattern.

Referring to FIGS. 9A and 9B, a second mask layer 170 may be formed on the insulation layer 120 to cover the first mask 135 and the spacer 165, and then a second photoresist layer pattern 180 may be formed on the second mask layer 170.

In plan view, the second photoresist layer pattern 180 may have a third opening 181*b* exposing a top surface of the second mask layer 170. That is, the third opening 181*b* may be defined by sidewalls of the second photoresist layer pattern 180 and the top surface of the second mask layer 170. In this case, the third opening 181*b* may have an uneven boundary at one end portion in the first direction. That is, a first end portion of the third opening 181*b* may include a first protrusion portion 182*b* projecting in the first direction, and a second end portion opposite to the first end portion may have a straight or even boundary. In example embodiments, a plurality of first protrusion portions 182*b* may be arranged in the second direction. The width of the third opening 181*b* in the first direction may change according to the first protrusion portions 182*b*.

As illustrated in FIG. 9A, the first protrusion portion 182*b* may have a rectangular shape, in plan view. However, the present disclosure may not be limited thereto. For example, the protrusion portion 182*b* may have various shapes such as a triangle shape, a semicircular shape, a semi-elliptical shape, a polygonal shape, etc.

In some embodiments, each of the first protrusion portions 182*a* may partially overlap two of the second line patterns.

Referring to FIG. 10, processes substantially similar to those illustrated with reference to FIGS. 6A, 6B and 6C may be performed.

That is, a second mask 175 may be formed by partially removing the second mask layer 170 using the second photoresist layer pattern 180 as an etching mask. The portion of the second mask layer 170 exposed by the third opening 181*b* may be removed, so that portions of the insulation layer 120 may be exposed. In this case, the portions of the insulation layer 120 may have a zigzag shape.

Referring to FIG. 11, in some embodiments, processes substantially similar to those illustrated with reference to FIGS. 7 and 8 may be performed.

That is, first trenches 185 and second trenches 187 may be formed by removing the insulation layer 120 and the etch stop layer 110 by using the first and second masks 135 and 175 and the spacer 165 as an etching mask. Then, first patterns 195 and second patterns 197 may be formed in the first trenches 185 and the second trenches 187, respectively.

The first patterns 195 may have a length in the first direction substantially larger than that of the second patterns 197. That is, end portions of the first patterns 195 may protrude from (or extend past) end portions of the second patterns 197 in the first direction. Also, the first patterns 195 and the second patterns 197 may be arranged alternately and repeatedly in the second direction. Therefore, end portions of the first patterns 195 and the second patterns 197 may be offset from each other.

According to some embodiments, the first patterns 195 and the second patterns 197 may be arranged alternately and repeatedly. Each of the first patterns 195 may have end portion projecting in the first direction. Therefore, when the first and second patterns 195 and 197 are used as a bit line of a semiconductor device, a trim process for separating the bit line may be omitted.

Figure 12:
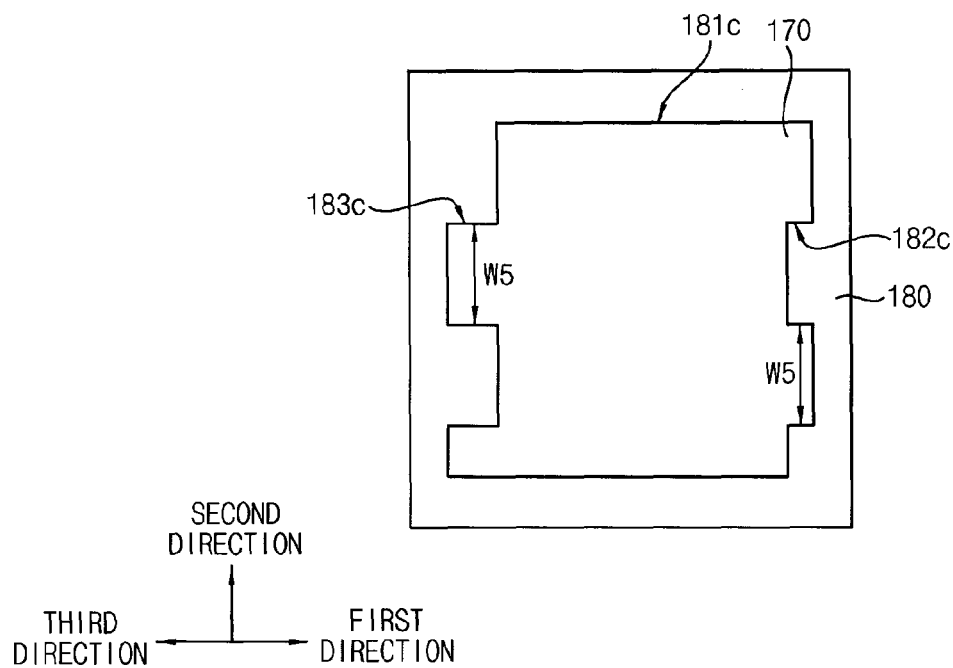
Figure 13:
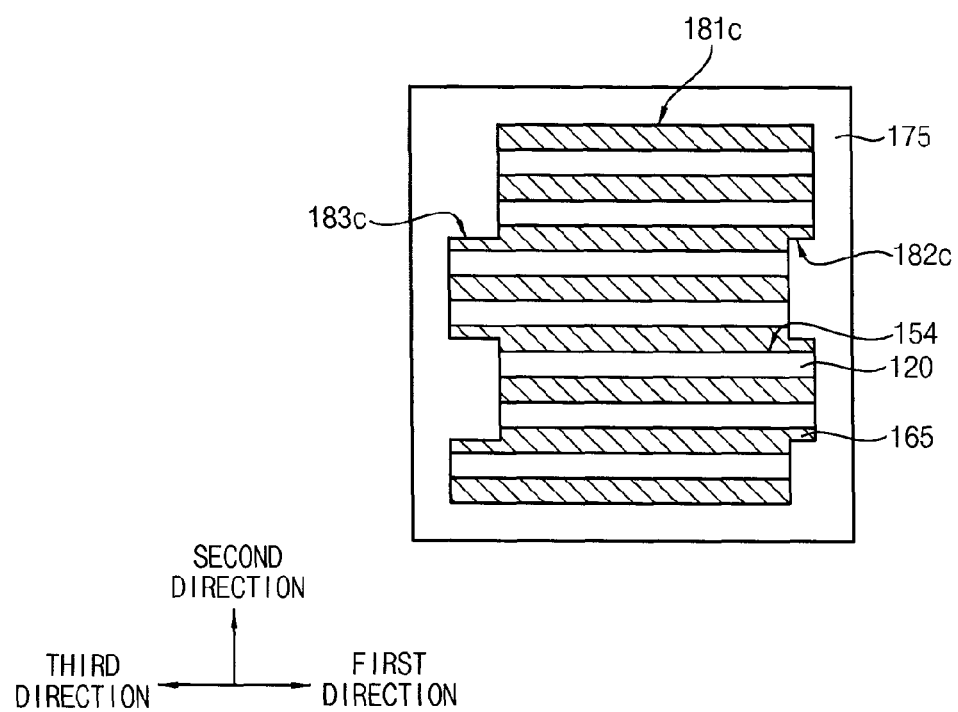
Figure 14:
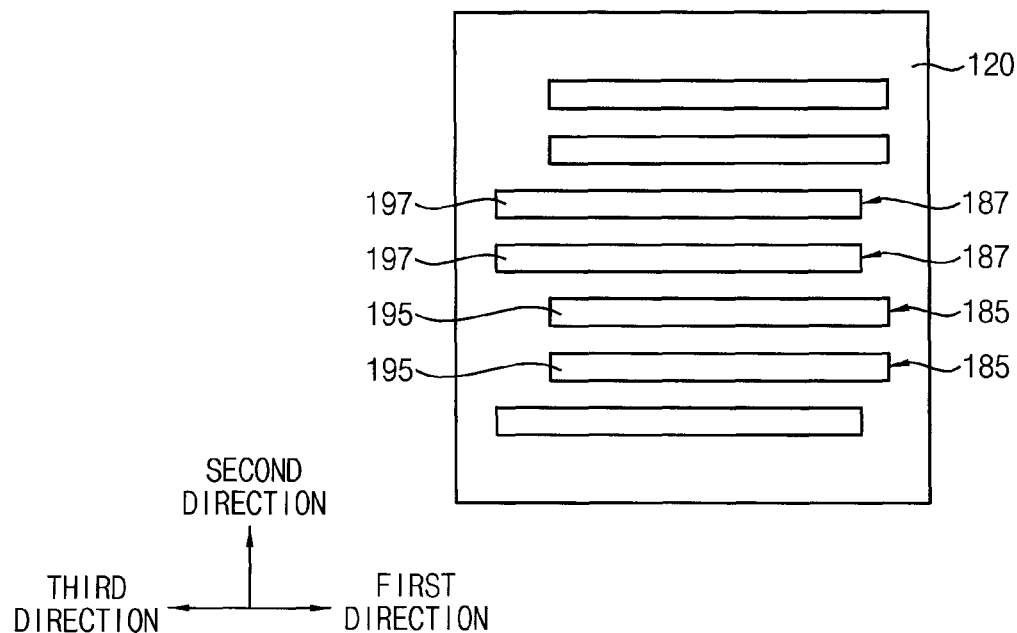

FIGS. 12 to 14 are plan views illustrating a method of forming a pattern in accordance with other example embodiments. The method of forming the pattern may be substantially the same as or similar to those illustrated with reference to FIGS. 1 through 8. Thus, like reference numerals refer to like elements, and repetitive explanations thereon may be omitted herein.

Firstly, processes substantially the same as or similar to those illustrated with reference to FIGS. 1 to 4 may be performed. That is, an etch stop layer 110 and an insulation layer 120 may be formed on a substrate 100, a first mask 135 and a spacer 165 may be formed on the insulation layer 120. In this case, the first mask 135 may include a plurality of second line patterns and a second connection pattern.

Referring to FIG. 12, a second mask layer 170 may be formed on the insulation layer 120 to cover the first mask (not shown) and the spacer (not shown), and then a second photoresist layer pattern 180 may be formed on the second mask layer 170.

In plan view, the second photoresist layer pattern 180 may have a third opening 181c exposing a top surface of the second mask layer 170. The third opening 181c may have a plurality of first protrusion portions 182c and a plurality of second protrusion portions 183c. The third opening 181c may be substantially similar to the third opening 181a of FIG. 5A except that the first protrusion portions 182c and the second protrusion portions 183c may have a fifth width W5 substantially larger than those of the first protrusion portions 182a and the second protrusion portions 183a in FIG. 5A. In example embodiments, each of the first protrusion portions 182c and the second protrusion portions 183c may partially overlap at least three of the second line patterns.

Referring to FIG. 13, processes substantially similar to those illustrated with reference to FIGS. 6A, 6B and 6C may be performed.

That is, a second mask 175 may be formed by partially removing the second mask layer 170 using the second photoresist layer pattern 180 as an etching mask. Further, a plurality of second openings 154 defined by the spacer and the first mask may be formed again to expose portions of the insulation layer 120.

In example embodiments, each of the first protrusion portions 182c and each of the second protrusion portions 183c may overlap at least two of the second openings 154.

Referring to FIG. 14, processes substantially similar to those illustrated with reference to FIGS. 7A through 8C may be performed.

That is, first trenches 185 and second trenches 187 may be formed by removing the insulation layer 120 and the etch stop layer 110 by using the first and second masks 135 and 175 and the spacer 165 as an etching mask. Then, first patterns 195 and second patterns 197 may be formed in the first trenches 185 and the second trenches 187, respectively, similar to the processes shown in FIGS. 7A through 8C.

In this case, the plurality of first patterns 195 and second patterns 197 may be arranged according to the first and second protrusion portions 182c and 183c. Two or more first patterns 195 may be arranged adjacent to each other, and two or more second patterns 197 may be arranged adjacent to each other. Further, the adjacent first patterns 195 and the adjacent second patterns 197 may be arranged alternately and repeatedly. In example embodiment, the couples of adjacent first patterns 195 and the couples of adjacent second patterns 197 may be arranged in a staggered, offset pattern.

According to example embodiments, two or more first patterns 195 and two or more second patterns 197 may be arranged alternately and repeatedly. Each of the first patterns 195 may have an end portion projecting past the second patterns 197 in the first direction, and each of the second patterns 197 may have an end portion projecting past the first patterns 195 in the third direction. Therefore, when the first and second patterns 195 and 197 are used as a bit line of a semiconductor device, a trim process for separating the bit line may be omitted.

FIGS. 15 to 24 are plan views and cross-sectional views illustrating a method of forming a pattern in accordance with some other example embodiments.

Figure 16:
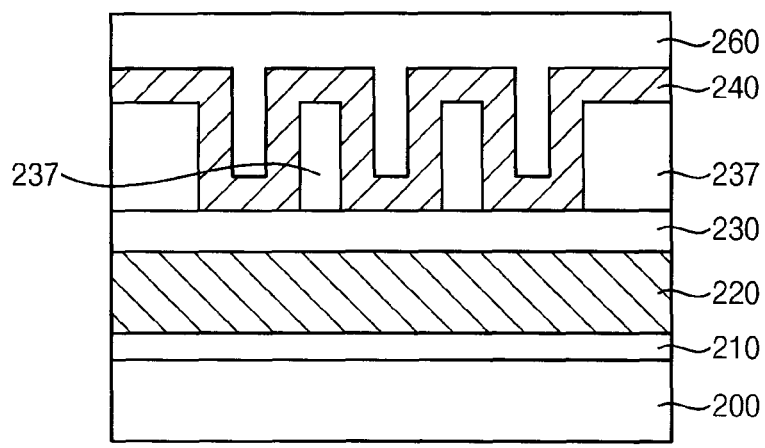
Figure 17:
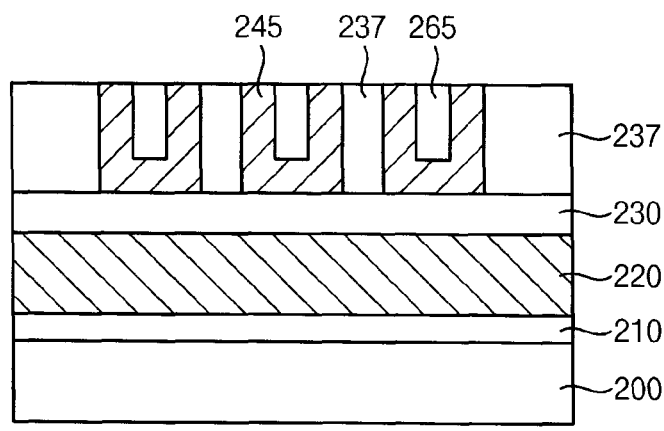
Figure 18:
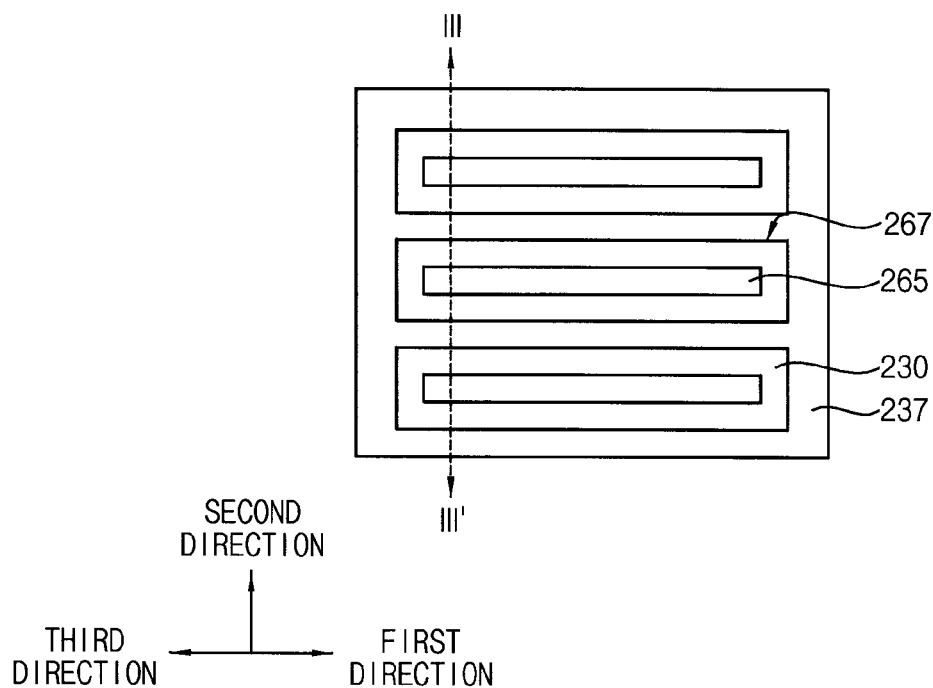
Figure 19:
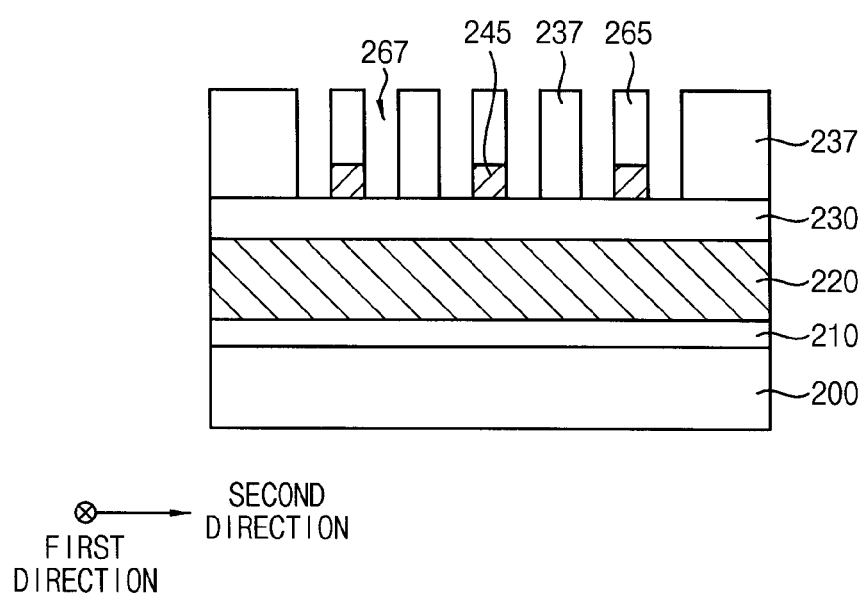
Figure 20:
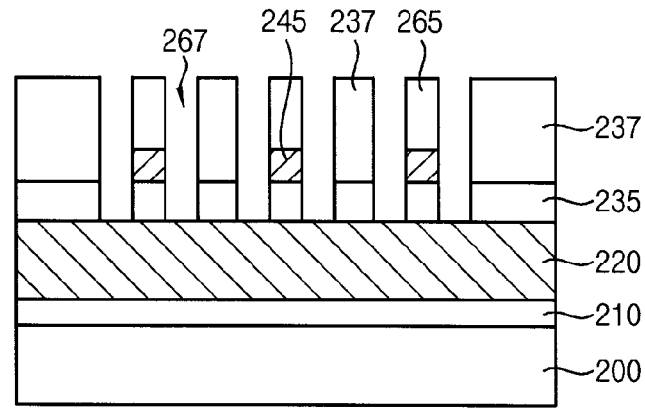
Figure 21:
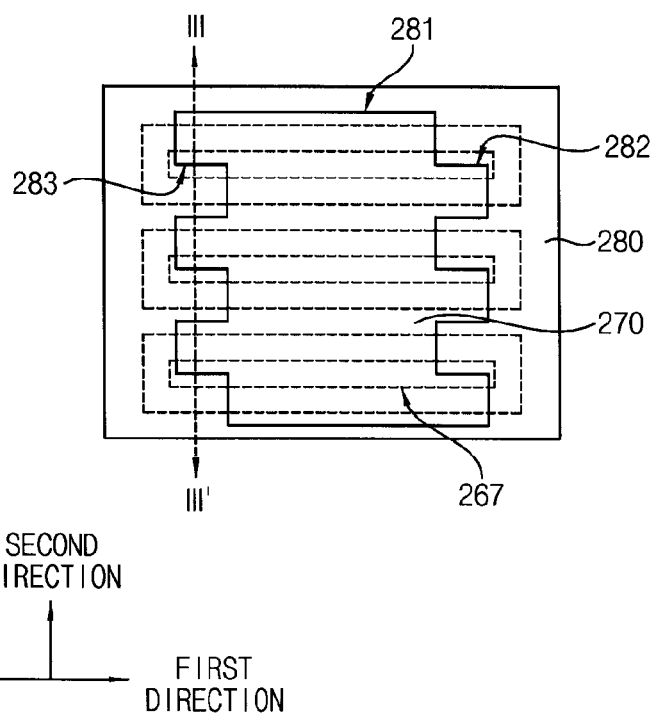
Figure 22:
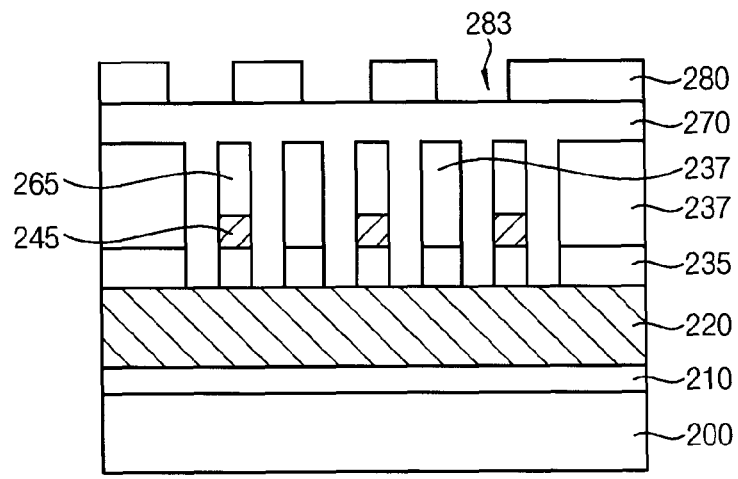
Figure 23:
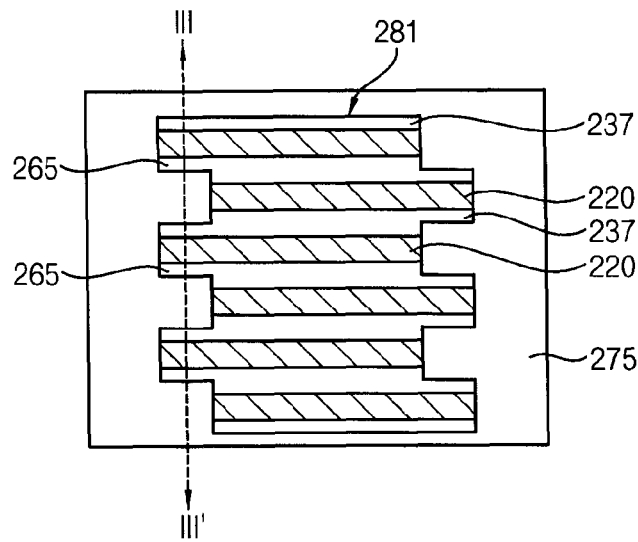
Figure 24:
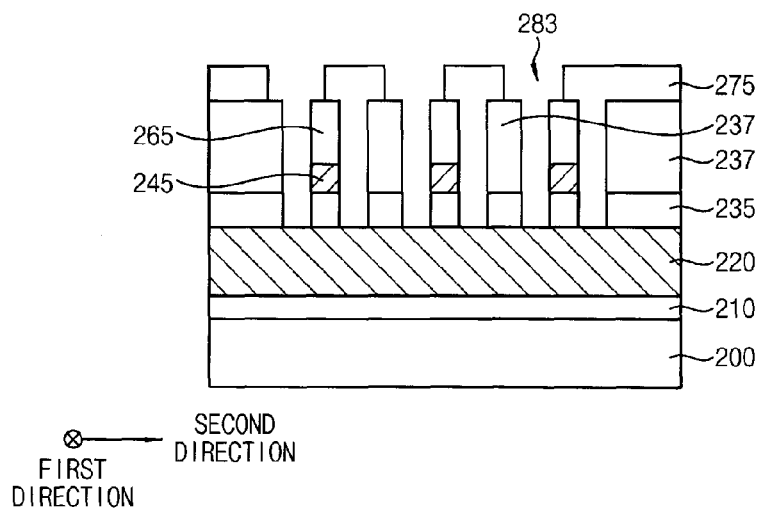

FIGS. 18, 21 and 23 are plan views illustrating the method of forming the pattern in accordance with example embodiments, and FIGS. 15, 16, 17, 19, 20, 22 and 24 are cross-sectional views illustrating the method of forming the pattern in accordance with example embodiments. Particularly, FIGS. 19, 22 and 24 are cross-sectional views cut along the line III-III' in FIGS. 18, 21 and 23. The method of forming the pattern may be substantially similar to those illustrated with reference to FIGS. 1 to 8. Thus, like reference numerals refer to like elements, and repetitive explanations thereon may be omitted herein.

Figure 15:
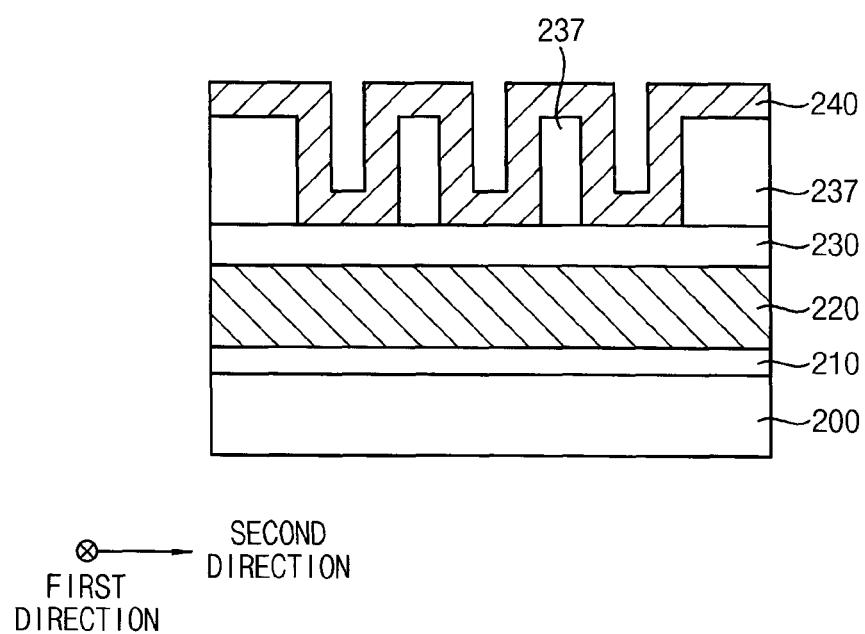

Referring to FIG. 15, processes substantially similar to those illustrated with reference to FIGS. 1 and 2 may be performed. That is, an etch stop layer 210, an insulation layer 220, a first mask layer 230 and a dummy pattern 237 may be sequentially formed on a substrate 200, and then a spacer layer 240 having a substantially uniform thickness may be formed on a top surface of the first mask layer 230, and a side wall and a top surface of the dummy pattern 237.

The process for forming the dummy pattern 237 may be substantially similar to the process for forming the sacrificial layer pattern 145 of FIG. 2, and the process for forming the spacer layer 240 may be substantially similar to the process for forming the spacer layer 160 of FIG. 2. In an example embodiment, the spacer layer 240 may be formed by an ALD process, thereby having a substantially uniform thickness.

Referring to FIG. 16, a preliminary mask layer 260 may be formed on the spacer layer 240.

In example embodiments, the preliminary mask layer 260 may include a material substantially the same as or similar to that of the dummy pattern 237. Further, the preliminary mask layer 260 may have a top surface that is substantially flat.

Referring to FIG. 17, upper portions of the preliminary mask layer 260 and the spacer layer 240 may be removed to form a preliminary mask 265 and a spacer 245.

In example embodiments, to remove the upper portion of the preliminary mask layer 260 and the spacer layer 240, a planarization process may be performed until the top surface of the dummy pattern 237 is exposed.

The preliminary mask 265 and the dummy pattern 237 may be separated by the spacer 245. The spacer 245 may have a substantially uniform thickness, so that the preliminary mask 265 and the spacer 245 may be spaced apart from each other at a predetermined thickness.

Referring to FIGS. 18 and 19, the spacer 245 may be partially removed to form a first opening 267 exposing portions of the first mask layer 230.

The spacer 245 may be partially removed by an etching process using an etching gas having a relatively high etch rate with respect to the spacer 245. The etching process may be an anisotropic etching process, so than portions of the spacer 245 under the preliminary mask 265 may not be removed.

The first opening 267 may have a closed loop shape, in plan view. In some embodiments, a plurality of first openings 267 may be arranged in the second direction, and each of the first openings 267 may extend in the first direction.

Referring to FIG. 20, the first mask layer 230 may be partially removed using the preliminary mask 265 and the dummy pattern 237 as an etching mask, thereby forming a first mask 235. Therefore, the first openings 267 may expose portions of the insulation layer 220.

Referring to FIGS. 21 and 22, a second mask layer 270 may be formed on the insulation layer 220, the first mask 235, the preliminary mask 265 and the dummy pattern 237 to fill the first openings 267, and then a second photoresist layer pattern 280 may be formed on the second mask layer 270 to form the second opening 281.

The second opening 281 may have a shape substantially the same as or similar to that of the third opening 181a of FIG. 5A.

In this case, the second opening 281 may have an uneven boundary extending along the second direction at end portions in the first and third directions. That is, a first end portion of the second opening 281 may include a first protrusion portion 282 projecting in the first direction, and a second end portion, opposite to the first end portion, may include a second protrusion portion 283 projecting in a third direction opposite to the first direction. In example embodiments, a plurality of first protrusion portions 282 and a plurality of second protrusion portions 283 may be arranged in the second direction.

In an example embodiment, the first protrusion portion 282 and the second protrusion portion 283 may not overlap in the first direction. Therefore, the plurality of first protrusion portions 282 and second protrusion portions 283 may be arranged alternately and repeatedly. That is, the plurality of first protrusion portions 282 and second protrusion portions 283 may be arranged in a staggered pattern, and the second opening 281 may have a substantially uniform width in the first direction.

Referring to FIGS. 23 and 24, the second mask layer 270 may be partially removed using the second photoresist layer pattern 280 as an etching mask, thereby forming the second mask 275.

Then, processes substantially the same as or similar to those illustrated with reference to FIGS. 7 and 8 may be performed to complete a plurality of patterns.

According to, example embodiments, a plurality of patterns may be arranged alternately and repeatedly. Therefore, when the patterns are used as a bit line of a semiconductor device, a trim process for separating the bit line may be omitted.

FIGS. 25 to 32 are plan views and cross-sectional views illustrating a method of manufacturing a semiconductor device in accordance with some embodiments.

Figure 25:
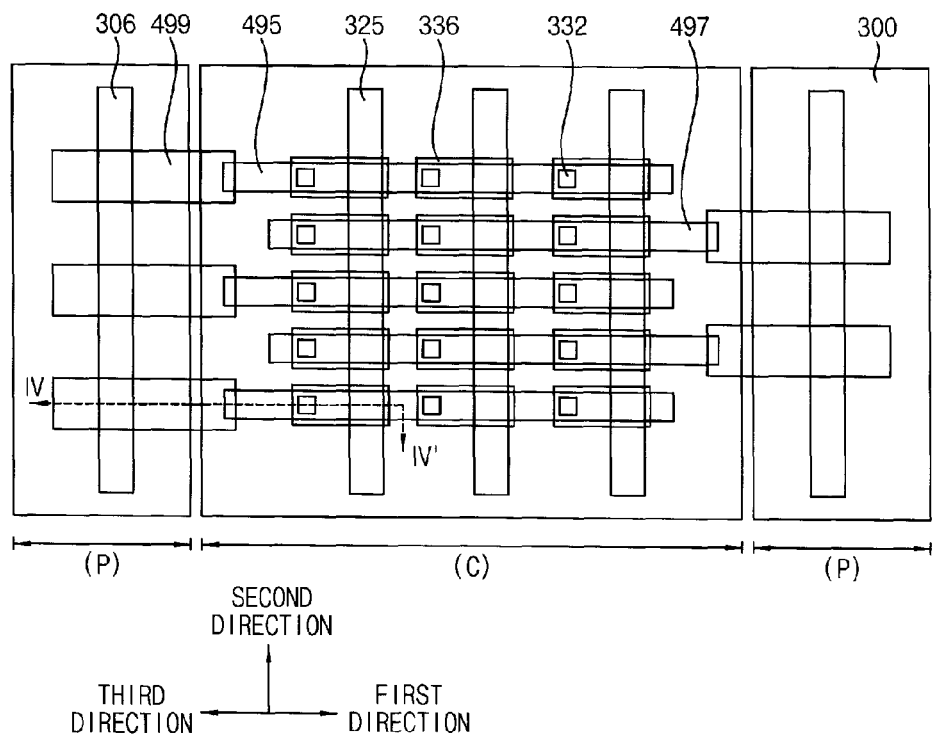

Particularly, FIG. 25 is a plan view illustrating the method of manufacturing the semiconductor device, and FIGS. 26 to 32 are cross-sectional views cut along the line IV-IV' in FIG. 25. FIGS. 26 to 32 are cross-sectional views of a cell region (C) and a peripheral region (P).

Referring to FIG. 25, the semiconductor device may include a plurality of first and second bit lines 495 and 497, a plurality of digit lines 325 and a plurality of magnetic memory cells (not illustrated) in the cell region (C). The plurality of first bit lines 495 and the plurality of second bit lines 497 may be arranged alternately and repeatedly in a second direction, and each of the first and second bit lines 495 and 497 may extend in a first direction. Also, the plurality of digit lines 325 may extend in the second direction. The plurality of magnetic memory cells may be disposed at intersections between the first and second bit lines 495 and 497 and the digit lines 325. The magnetic memory cells may include a pad 336 and a contact 332.

On the other hand, the semiconductor device may include a plurality of third bit lines 499, a plurality of first gate electrodes 306 (that is, word lines) and a plurality of transistors in the peripheral region (P). The plurality of transistors may be disposed at intersections between the plurality of first gate electrodes 306 and the plurality of third bit lines 499.

In example embodiments, first end portions of the first bit lines 495 may project in a third direction opposite to the first direction, and second end portions of the second bit lines 497 may project in the first direction. Therefore, each of the first and second bit lines 495 and 497 may be electrically connected to the third bit line 499 having a relatively large width.

Figure 26:
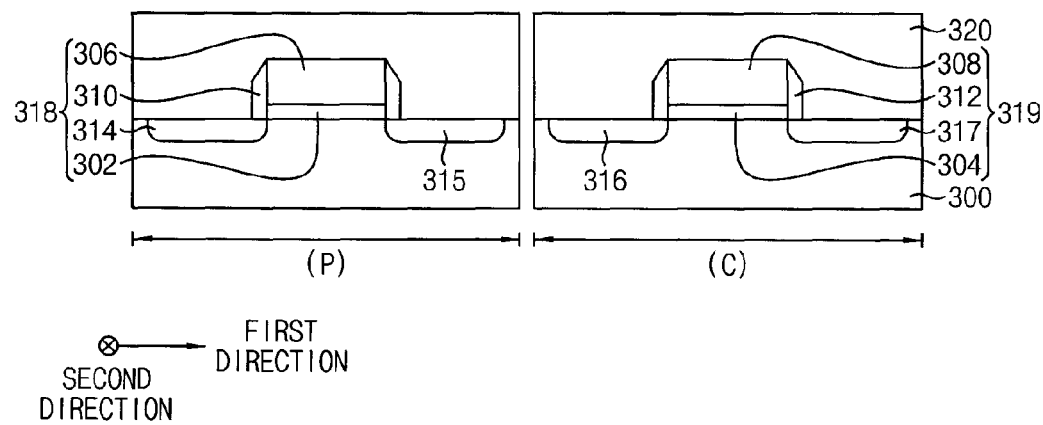

Referring to FIG. 26, transistors 318 and 319 may be formed on a substrate 300, and then a first insulating interlayer 320 may be formed to cover the transistors 318 and 319.

The substrate 300 may include a semiconductor substrate. For example, the substrate 300 may include as a silicon substrate, a germanium substrate or a silicon-germanium substrate, a silicon-on-insulator (SOI) substrate or a germanium-on-insulator (GOI) substrate.

The first transistor 318 may be formed in the peripheral region (P) on the substrate 300, and the second transistor 319 may be formed in the cell region (C) on the substrate 300.

Particularly, a gate insulation layer and a gate electrode layer may be sequentially formed on the substrate 300, and then the gate insulation layer and the gate electrode layer may be patterned to form a first gate insulation layer pattern 302 and a first gate electrode 306 in the peripheral region (P), and to form a second gate insulation layer pattern 304 and a second gate electrode 308 in the cell region (C). Further, a first sidewall spacer 310 and a second sidewall spacer 312 may be formed on sidewalls of the first and second gate insulation layer patterns 302 and 304 and the first and second gate electrodes 306 and 308, respectively. First to fourth impurity regions 314, 315, 316 and 317 may be formed at upper portions of the substrate 300 adjacent to the first and second gate insulation layer patterns 302 and 304 by implanting impurities.

Figure 27:
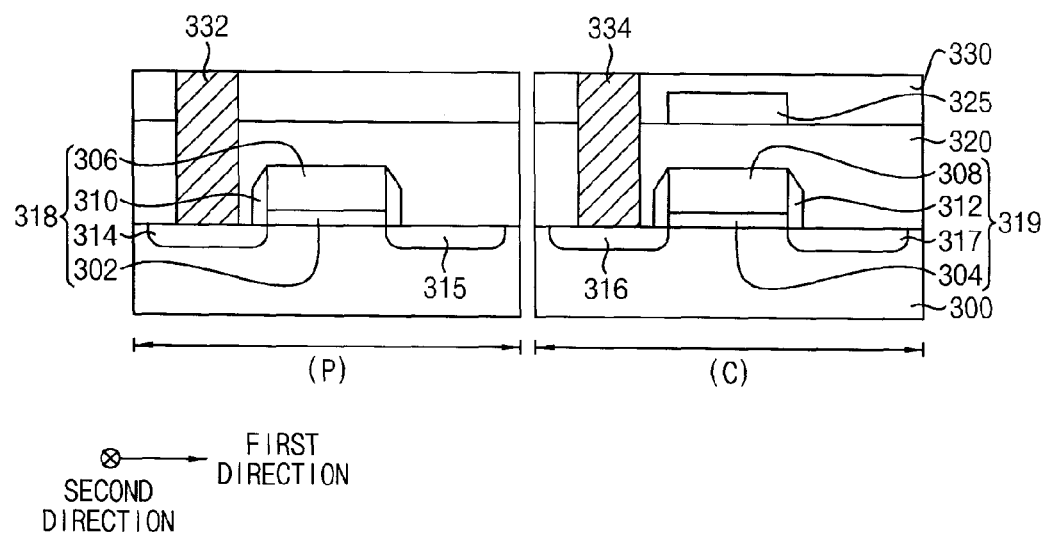

Referring to FIG. 27, a digit line 325 may be formed on the first insulating interlayer 320, a second insulating interlayer 330 may be formed on the first insulating interlayer 320 to cover the digit line 325, and then a first contact 332 and a second contact 334 may be formed through the first and second insulating interlayers 320 and 330.

The digit line 325 may be formed on the first insulating interlayer 320 to extend in the second direction. The digit line 325 may generate a magnetic field that may control a direction of magnetization in a magnetic tunnel junction pattern 338 (See FIG. 28).

In example embodiments, the first and second insulation interlayers 320 and 330 may be formed using an insulation material such as silicon oxide.

The first and second insulating interlayers 320 and 330 may be partially removed to form contact holes exposing the first and third impurity regions 314 and 316. A conductive layer may be formed on the second insulating interlayer 330 to fill the contact holes, and then the conductive layer may be planarized to form the first contact 332 and the second contact 334, respectively.

Therefore, the first contact 332 may be electrically connected to the first impurity region 314, and the second contact 334 may be electrically connected to the third impurity region 316.

Figure 28:
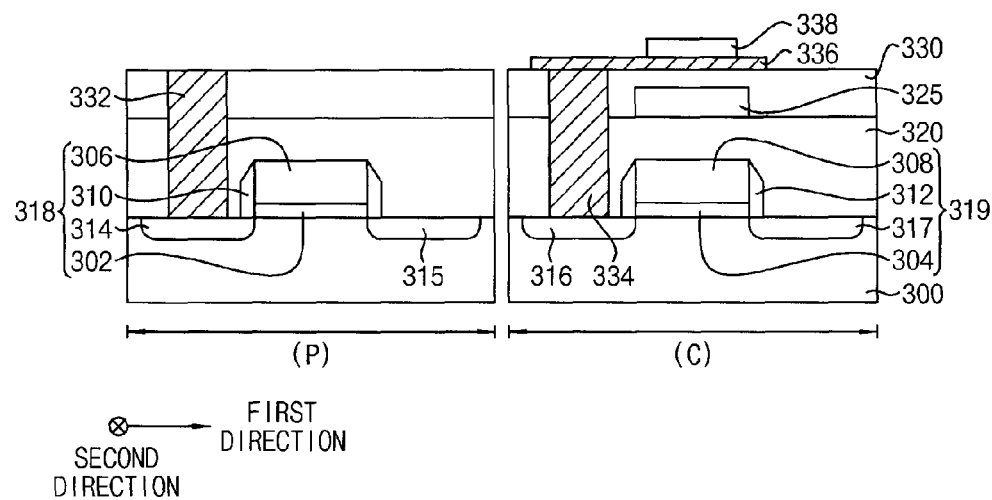

Referring to FIG. 28, a pad 336 and a magnetic tunnel junction (MTJ) pattern 338 may be formed on the second insulating interlayer 330 and the second contact 334.

The pad 336 may be formed by forming a conductive layer on the second insulating interlayer 330 and the second contact 334, and by patterning the conductive layer. In example embodiments, the pad 336 may be electrically connected to the second contact 334, and may be overlapped with the digit line 325. The pad 336 may serve as a lower electrode of the MJT pattern 338.

The MJT pattern 338 may be formed on the pad 336 to overlap the digit line 325. The MJT pattern 338 may include a pinning layer pattern, a pinned layer pattern, a tunneling layer pattern and/or a free magnetic layer pattern disposed on the pad 336. Although it is not specifically illustrated, various types of MTJ patterns may be formed. For example, a pinning layer pattern may not be included. Also, multiple pinned layers formed with a free magnetic layer pattern therebetween. In addition, the present disclosure may be applied to other types of magnetic memory devices. Therefore, other types of data storage layers including a magnetic pattern other than the MTJ patterns discussed in the present disclosure may be used.

The digit line 325 may be disposed under the MTJ pattern 338 in FIG. 28, however the present invention may not be limited thereto. For example, the digit line 325 may be disposed above the MTJ pattern 338.

Figure 29:
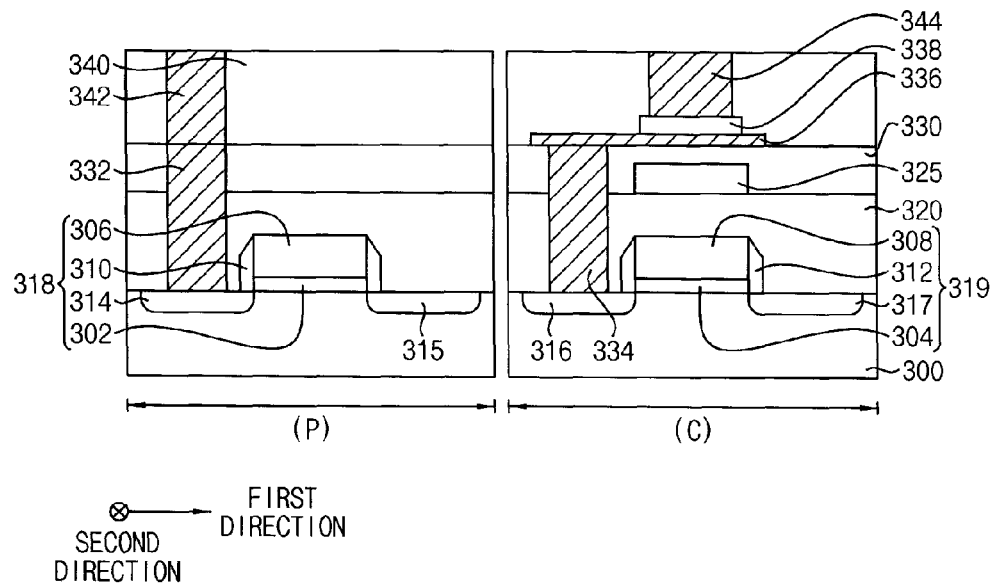

Referring to FIG. 29, a third insulating interlayer 340 may be formed on the second insulating interlayer 330 to cover the pad 336 and the MTJ pattern 338, and then a third contact 342 and a fourth contact 344 may be formed through the third insulating interlayer 340.

The third insulating interlayer 340 may be formed using a material substantially the same as that of the first insulating interlayer 320. Then, the third insulating interlayer 340 may be partially removed to form contact holes exposing the first contact 332 and the MTJ pattern 338. A conductive layer may be formed on the third insulating interlayer 340 to fill the contact holes, and then the conductive layer may be planarized to form the third contact 342 and the fourth contact 344, respectively.

Therefore, the third contact 342 may be electrically connected to the first contact 332, and the fourth contact 344 may be electrically connected to the MTJ pattern 338. In example embodiments, an upper electrode may be further formed between the fourth contact 344 and the MTJ pattern 338.

Figure 30:
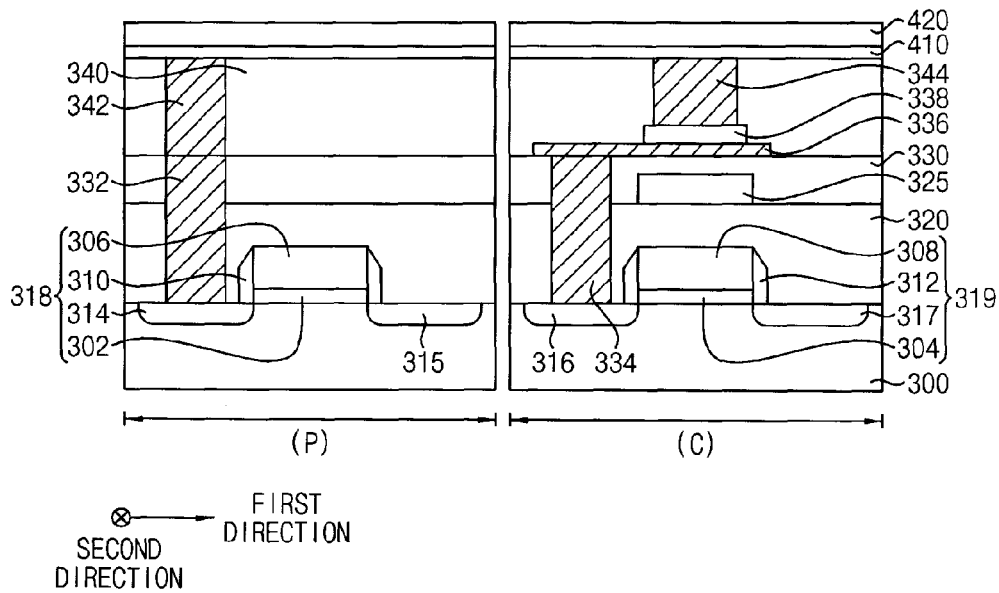

Referring to FIG. 30, an etch stop layer 410 and the insulation layer 420 may be sequentially formed on the third insulating interlayer 340, the third contact 342 and the fourth contact 344. Processes for forming the etch stop layer 410 and the insulation layer 420 may be substantially similar to those described with reference to FIG. 1.

Figure 31:
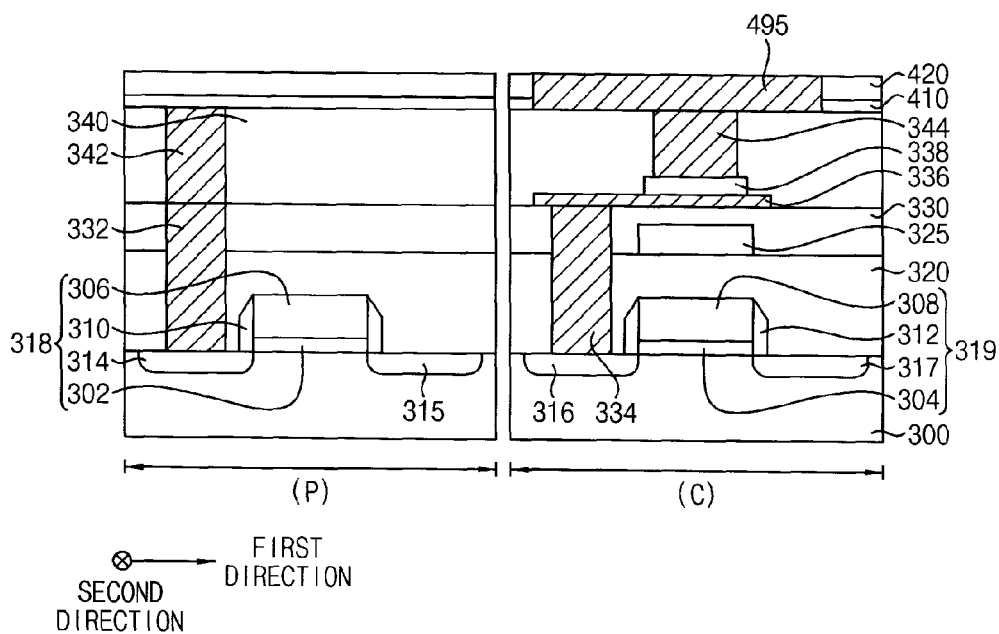

Referring to FIG. 31, processes substantially the same as or similar to those illustrated with reference to FIGS. 1 to 8 may be performed to form a plurality of bit lines, e.g., first bit lines 495 and second bit lines 497 in the cell region (C). As illustrated in FIG. 25, the first bit lines 495 may be shifted in a third direction opposite to the first direction, and the second bit lines 497 may be shifted in the first direction. Also, the first bit lines 495 and the second bit lines 497 may be arranged alternately and repeatedly in the second direction. That is, the first bit lines 495 and the second bit lines 497 may be arranged in a staggered pattern.

Alternatively, the first bit lines 495 and the second bit lines 497 may be formed in accordance with other example embodiments. For example, the first bit lines 495 and the second bit lines 497 may be formed by processes substantially the same as or similar to those illustrated with reference to FIGS. 9 to 11, FIGS. 12 to 14 or FIGS. 15 to 24.

Figure 32:
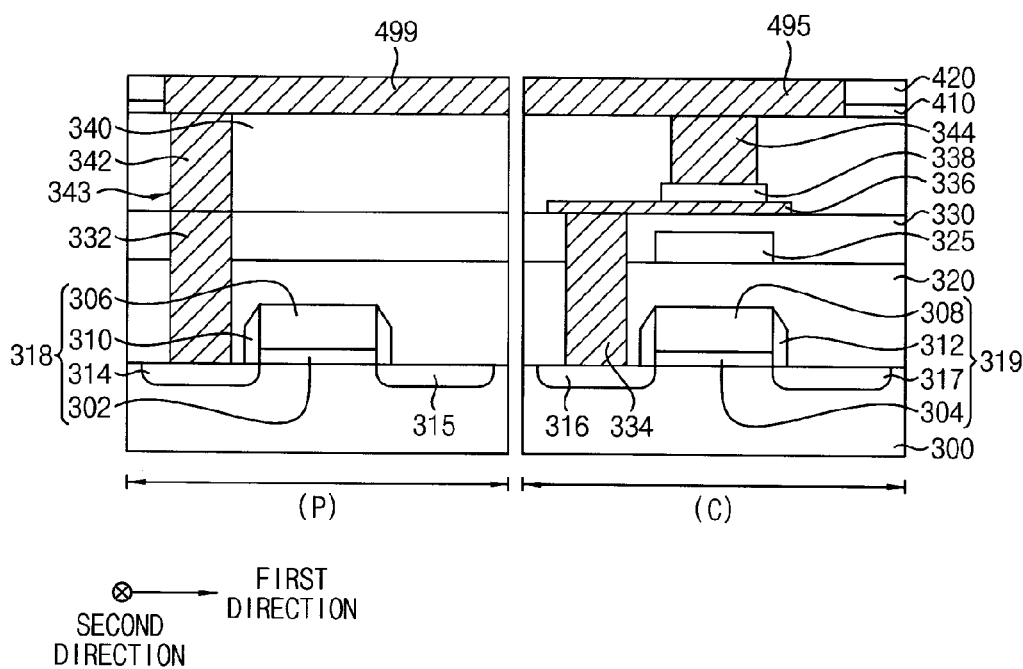

Referring to FIG. 32, a third bit line 499 may be formed to be electrically connected to the third contact 342.

Particularly, the etch stop layer 410 and the insulation layer 420 may be partially removed to form a trench 343 exposing the third contact 342. A conductive layer may be formed on the third insulating interlayer 340 to fill the trench 343, and then the conductive layer may be planarized to form the third bit line 499.

The third bit line 499 may have a width in the second direction substantially larger than those of the first and second bit lines 495 and 497. However, the first and second bit lines 495 and 497 may be arranged in a staggered pattern such that end portions of the first and second bit lines 495 and 497 may be easily connected to the third bit line 499.

Figure 33:
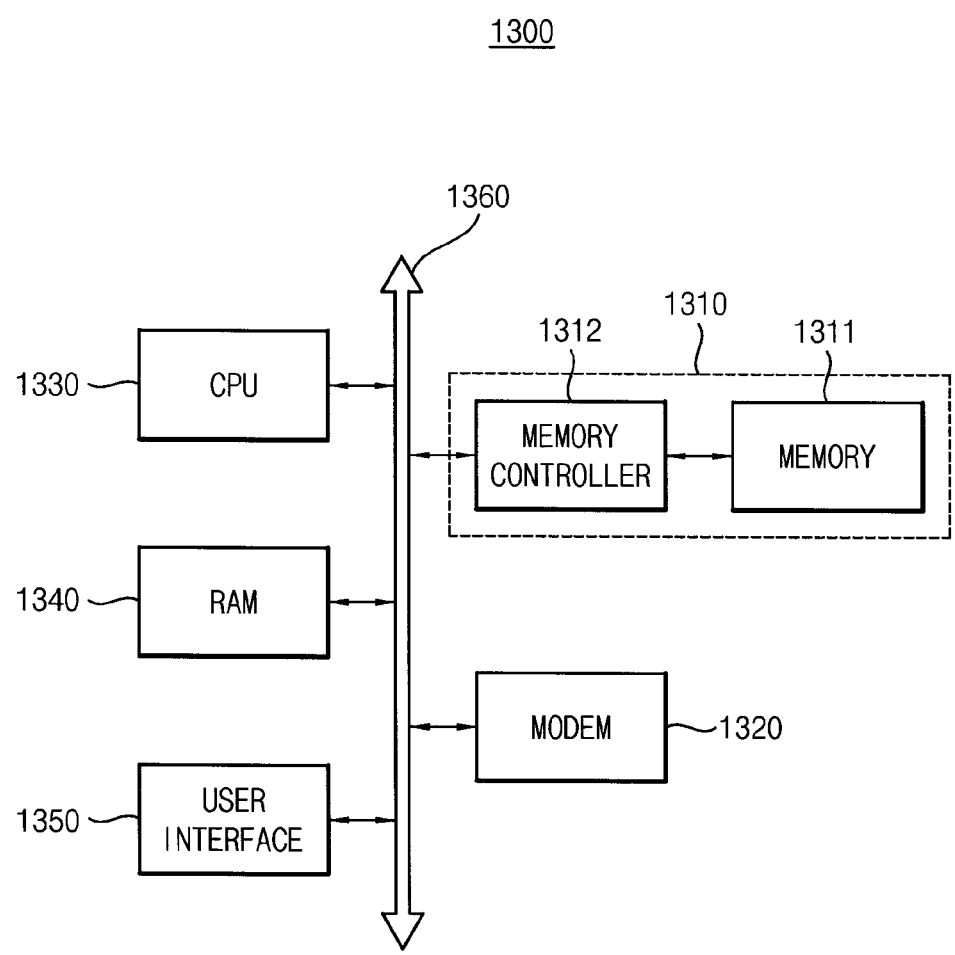

FIG. 33 is a schematic block diagram illustrating an example of information processing systems including a semiconductor device according to example embodiments of the present disclosure.

Referring to FIG. 33, an information processing system 1300 includes a memory system 1310, which may include at least one of the semiconductor memory devices according to example embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may constitute a solid state drive SSD, and thus, the information processing system 1300 may be able to store reliably a large amount of data in the memory system 1310. Although not shown in the drawing, it will be apparent to those of ordinary skill in the art that the information processing system 1300 may be also configured to include an application chipset, a camera image processor (CIS), and/or an input/output device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate having a gate electrode formed thereon, the gate electrode extending in a second direction;
   a magnetic tunnel junction pattern overlying the gate electrode;
   an insulating interlayer covering the magnetic tunnel junction pattern;
   an insulation layer overlying the insulating interlayer, the insulation layer including a plurality of trenches extending in a first direction substantially perpendicular to the second direction and arranged in the second direction, the plurality of trenches comprising at least one first trench and at least one second trench, the at least one first trench comprising a first end portion and a second end portion, the at least one second trench comprising a third end portion and a fourth end portion, the first end portion of the at least one first trench corresponding to the third end portion of the at least one second trench and the second end portion of the at least one first trench corresponding to the fourth end portion of the at least one second trench, the first end portion of the at least one first trench and the third end portion of the at least one second trench being in a staggered pattern with respect to each other and/or the second end portion of the at least one trench and the fourth end portion of the at least one second trench being in the staggered pattern with respect to each other; and a plurality of bit lines on the insulating interlayer, the plurality of bit lines respectively disposed in the plurality of trenches and electrically connected to the magnetic tunnel junction pattern, the plurality of bit lines comprising at least one first bit line and at least one second bit line; and a plurality of third bit lines, at least one of which is coupled to that at least one first bit line, wherein a width of the at least one of the plurality of third bit lines is greater than a width of the at least one first bit line, wherein the at least one first bit line comprises a first end portion and a second end portion, the at least one second bit line comprises a third end portion and a fourth end portion, the first end portion and the second end portion of the at least one first bit line respectively corresponds to the first end portion and the second end portion of the at least one first trench, the third end portion and the fourth end portion of the at least one second bit line respectively corresponds to the third end portion and the fourth end portion of the at least one second trench line, the first end portion of the at least one first bit line corresponds to the third end portion of the at least one second bit line and the second end portion of the at least one first bit line corresponds to the fourth end portion of the at least one second bit line.

2. The device of claim 1, which further comprises a digit line on the substrate, the digit line extending in the second direction, the magnetic tunnel junction pattern overlapping at least a portion of the digit line.

* * * * *